US008080479B2

(12) United States Patent
Collins et al.

(10) Patent No.: US 8,080,479 B2
(45) Date of Patent: *Dec. 20, 2011

(54) PLASMA PROCESS UNIFORMITY ACROSS A WAFER BY CONTROLLING A VARIABLE FREQUENCY COUPLED TO A HARMONIC RESONATOR

(75) Inventors: Kenneth S. Collins, San Jose, CA (US); Hiroji Hanawa, Sunnyvale, CA (US); Kartik Ramaswamy, San Jose, CA (US); Douglas A. Buchberger, Jr., Livermore, CA (US); Shahid Rauf, Pleasanton, CA (US); Kallol Bera, San Jose, CA (US); Lawrence Wong, Fremont, CA (US); Walter R. Merry, Sunnyvale, CA (US); Matthew L. Miller, Fremont, CA (US); Steven C. Shannon, San Mateo, CA (US); Andrew Nguyen, San Jose, CA (US); James P. Cruse, Soquel, CA (US); James Carducci, Sunnyvale, CA (US); Troy S. Detrick, Los Altos, CA (US); Subhash Deshmukh, San Jose, CA (US); Jennifer Y. Sun, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1062 days.

This patent is subject to a terminal disclaimer.

(21) Appl. No.: 11/733,858

(22) Filed: Apr. 11, 2007

(65) Prior Publication Data
US 2008/0182418 A1 Jul. 31, 2008

Related U.S. Application Data

(60) Provisional application No. 60/898,632, filed on Jan. 30, 2007.

(51) Int. Cl.
*H01L 21/302* (2006.01)
(52) U.S. Cl. ........ 438/714; 438/9; 438/706; 156/345.48; 216/68
(58) Field of Classification Search .................. 438/7, 9, 438/706, 710, 712, 714; 156/345.47, 48, 156/345.44; 216/58, 68
See application file for complete search history.

(56) References Cited

U.S. PATENT DOCUMENTS 5,272,417 A 12/1993 Ohmi ...................... 315/111.21
(Continued)

FOREIGN PATENT DOCUMENTS

CN 1476057 2/2004
(Continued)

OTHER PUBLICATIONS

Official Action Dated May 21, 2010 Issued in Co-Pending U.S. Appl. No. 11/733,764.
(Continued)

*Primary Examiner* — Lan Vinh
(74) *Attorney, Agent, or Firm* — Robert M. Wallace

(57) ABSTRACT

A method of processing a workpiece in a plasma reactor chamber includes coupling RF power via an electrode to plasma in the chamber, the RF power being of a variable frequency in a frequency range that includes a fundamental frequency f. The method also includes coupling the electrode to a resonator having a resonant VHF frequency F which is a harmonic of the fundamental frequency f, so as to produce VHF power at the harmonic. The method controls the ratio of power near the fundamental f to power at harmonic F, by controlling the proportion of power from the generator that is up-converted from f to F, so as to control plasma ion density distribution.

20 Claims, 14 Drawing Sheets

U.S. PATENT DOCUMENTS

| | | | |
|---|---|---|---|
| 6,544,380 B2 | 4/2003 | Tomoyasu et al. | 156/345.51 |
| 6,837,968 B2 | 1/2005 | Brown et al. | 156/345.51 |
| 6,853,141 B2 * | 2/2005 | Hoffman et al. | 315/111.21 |
| 2002/0031617 A1 | 3/2002 | Sumiya et al. | 427/569 |
| 2004/0035365 A1 | 2/2004 | Yamazawa et al. | 118/723 |
| 2004/0243269 A1 | 12/2004 | Nakano et al. | 700/108 |
| 2005/0082255 A1 | 4/2005 | Nagaseki et al. | 216/67 |
| 2005/0090118 A1 * | 4/2005 | Shannon et al. | 438/706 |
| 2006/0118518 A1 * | 6/2006 | Rusu et al. | 216/67 |
| 2006/0157201 A1 | 7/2006 | Hoffman et al. | 156/345.46 |
| 2006/0221540 A1 | 10/2006 | Himori et al. | 361/234 |
| 2007/0246163 A1 | 10/2007 | Paterson et al. | 156/345.48 |

FOREIGN PATENT DOCUMENTS

| | | | |
|---|---|---|---|
| CN | 1871695 A | | 11/2006 |
| JP | 3-162583 | | 7/1991 |
| JP | 2002246368 A | | 8/2002 |
| JP | 2003257935 | | 12/2003 |
| KR | 2001-0083202 | | 8/2001 |
| WO | WO2005/022623 A1 | | 3/2005 |

OTHER PUBLICATIONS

Official Action Dated Jul. 28, 2010 Issued in Co-Pending U.S. Appl. No. 11/733,770.
Official Action Dated Aug. 24, 2010 Issued in Co-Pending U.S. Appl. No. 11/734,040.
Official Action Dated Aug. 4, 2010 Issued in Co-Pending U.S. Appl. No. 11/733,913.
U.S. Appl. No. 11/733,764, filed Apr. 11, 2007, Collins et al.
U.S. Appl. No. 11/733,767, filed Apr. 11, 2007, Collins et al.
U.S. Appl. No. 11/733,770, filed Apr. 11, 2007, Collins et al.
U.S. Appl. No. 11/733,913, filed Apr. 11, 2007, Collins et al.
U.S. Appl. No. 11/733,984, filed Apr. 11, 2007, Collins et al.
U.S. Appl. No. 11/734,040, filed Apr. 11, 2007, Collins et al.
Official Action Dated Jun. 4, 2010 Issued in Co-Pending U.S. Appl. No. 11/733,767.
Official Action Dated Jun. 11, 2010 Issued in Co-Pending U.S. Appl. No. 11/733,913.

* cited by examiner

PLASMA PROCESS UNIFORMITY ACROSS A WAFER BY CONTROLLING A VARIABLE FREQUENCY COUPLED TO A HARMONIC RESONATOR

CROSS-REFERENCE TO RELATED APPLICATIONS

This application claims the benefit of U.S. Provisional Application Ser. No. 60/898,632, filed Jan. 30, 2007.

BACKGROUND

Embodiments of the present invention concern a capacitively coupled plasma source for processing a workpiece such as a semiconductor wafer. A capacitively coupled plasma source comprises a ceiling electrode that is driven at a very high frequency (VHF) frequency over 110 MHz which can produce a high density plasma at a relatively low voltage. A capacitively coupled plasma source can further produce a low electrode potential for low electrode erosion, and permits the ion energy at the wafer surface to be limited to a low level if desired, while operating over a wide range of plasma density (very low to very high plasma ion density). One problem inherent in such a plasma source is that the ceiling electrode exhibits radial transmission line effects and loading due to the effective dielectric constant of the plasma. For example, at 150 MHz, a free-space quarter wavelength is about 20 inches, which is on the order of the diameter of the ceiling electrode (about 15 inches). Therefore, the RF field varies significantly across the surface of the ceiling electrode, giving rise to process non-uniformities at the wafer surface. For a plasma with an effective dielectric constant greater than 1, the effective wavelength is reduced to less than the ceiling electrode diameter, worsening the non-uniformity of the RF field, making processing non-uniformities across the wafer surface worse. For an etch process, this may produce a non-uniform edge low etch rate distribution across the wafer surface.

Various approaches are employed to reduce such undesirable effects. In one approach, magnetic steering may be employed to alter the plasma ion distribution, e.g., to reduce its center-high non-uniformity to produce a somewhat flatter distribution. One problem with this approach is that a center-high non-uniformity of the source may be beyond the corrective capability of magnetic steering. Another problem with this approach can be electrical charging damage of the workpiece if the magnetic flux density is too high. In another approach, the plasma sheath (or bias) voltage is increased by applying more plasma RF bias power to the wafer. This has the effect of increasing the plasma sheath thickness which in turn typically decreases the capacitance across the ceiling-plasma sheath as well as the capacitance across the wafer-plasma sheath, thereby forming three capacitors in series, including the ceiling sheath capacitance, the plasma capacitance and the wafer sheath capacitance. The net effect is to reduce the effect of the dielectric constant of the plasma, thereby reducing the non-uniformity of the RF field. The high bias voltage required in some oxide etch plasma process recipes is compatible with this latter approach. However, a high plasma bias voltage is not desirable in some other types of plasma processes. The worst non-uniformities appear in processes employing the lowest plasma bias voltage.

Such approaches are complicated by the fact that other process conditions dictated by the process recipe have as great an effect upon plasma distribution as either magnetic steering or bias (sheath) voltage. For example, increasing chamber pressure produces a less center high and a more center low plasma ion distribution, while decreasing the chamber pressure produces a more center high distribution. Other changes in plasma distribution are caused by source power (plasma density), gas chemistry, electronegativity of the gas mixture, pumping rate, gas flow rate and other parameters dictated by the process recipe.

SUMMARY OF THE INVENTION

A method is provided for processing a workpiece in a plasma reactor chamber. The method includes coupling RF power via an electrode to plasma in the chamber, the RF power being of a variable frequency in a frequency range that includes a fundamental frequency f. The method also includes coupling the electrode to a resonator having a resonant VHF frequency F which is a harmonic of the fundamental frequency f, so as to produce VHF power at the harmonic. The method controls the ratio of power near the fundamental f to power at harmonic F, by controlling the proportion of power from the generator that is up-converted from f to F, so as to control plasma ion density distribution.

In one embodiment, the proportion of power up-converted is controlled by controlling the difference between the variable output frequency of the VHF generator and the fundamental frequency f. In one aspect, the difference between the variable output frequency and the fundamental frequency is controlled by varying the frequency of the variable frequency generator.

In one embodiment, the proportion of power that is up-converted is controlled so as to reduce a center-high plasma ion density distribution by decreasing the ratio of power at F relative to power at the frequency f. In another embodiment, the proportion of power that is up-converted is controlled so as to reduce an edge-high plasma ion density distribution nonuniformity by decreasing the ratio of power at the frequency f relative to power at the frequency F.

In another embodiment, the method further includes providing a first center return path for the harmonic frequency F and a second center return path for a lower frequency near f, and providing an edge return path. In this embodiment, the method can include adjusting the impedance of the first center return path relative to the impedance of the edge return path to promote current flow at the frequency F to the center return path. Alternatively, the method can include adjusting the impedance of the second center return path relative to the impedance of the edge return path to promote current flow at the f frequency to the side wall.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION OF THE INVENTION

Figures 1A, 1B:
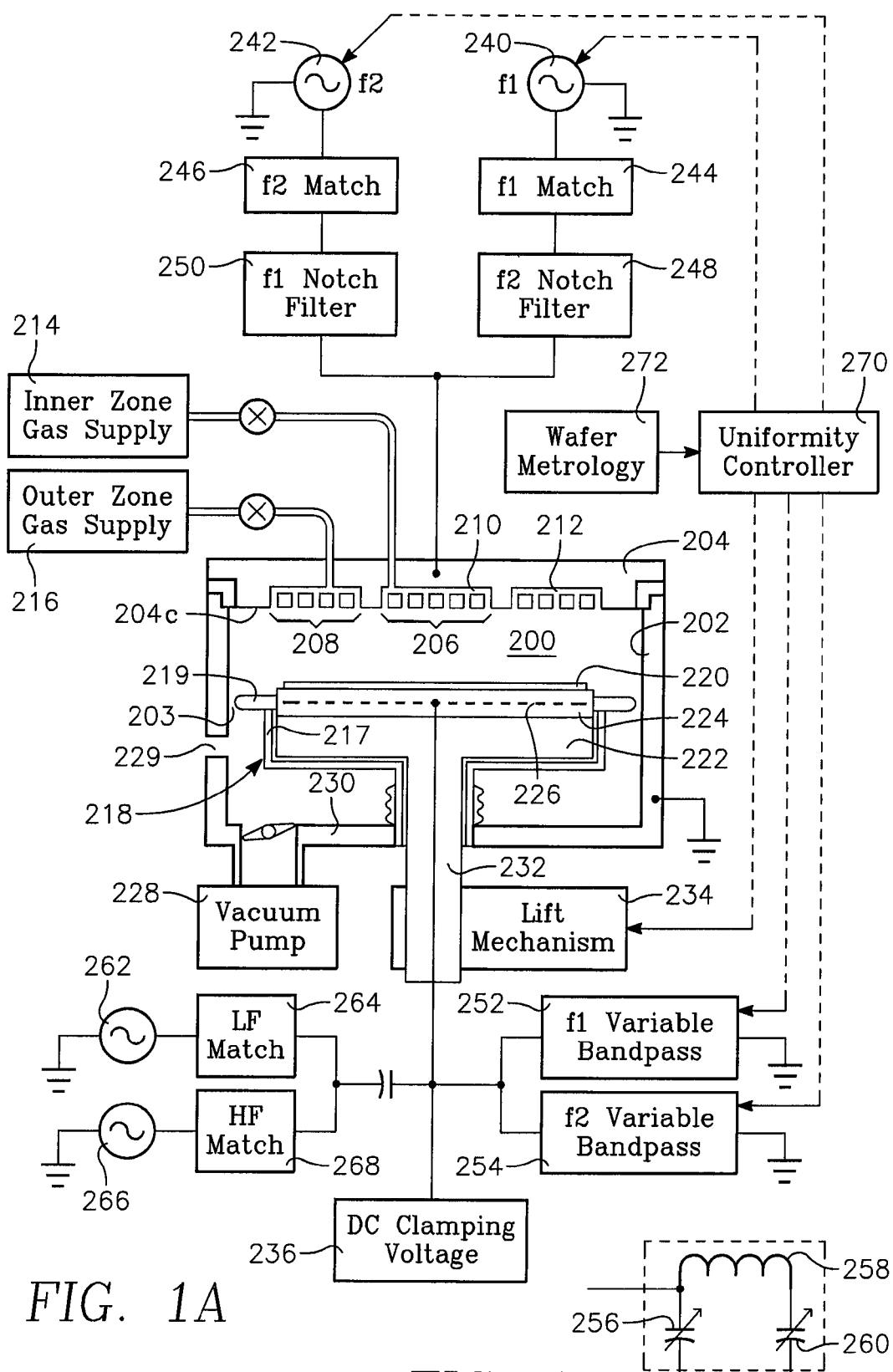
FIG. 1A illustrates a plasma reactor having multiple VHF source power frequencies applied to a ceiling electrode.
FIG. 1B depicts elements of a variable reactance or band-pass filter controlling the impedance of an RF ground return path in the reactor of FIG. 1A.

FIG. 1A is a simplified schematic diagram of a plasma reactor capable of controlling radial distribution of plasma ion density by apportioning capacitively coupled plasma source power among different source power frequencies. The reactor has a vacuum chamber 200 enclosed by a cylindrical side wall 202 and a disk-shaped ceiling 204. The ceiling 204 is both a conductive ceiling electrode as well as a gas distribution showerhead or plate, and will be referred to herein as the ceiling electrode 204. The ceiling electrode may optionally be covered with a conducting, semiconducting or insulating material. The ceiling electrode 204 includes inner and outer zones 206, 208 of gas injection orifices on its bottom surface 204c coupled to respective inner and outer internal gas manifolds 210, 212. Inner and outer zone process gas supplies 214, 216 furnish process gases to the inner and outer manifolds 210, 212. A wafer support pedestal 218 can support a workpiece such as a semiconductor wafer 220. The pedestal 218 may have the features of an electrostatic chuck, including a conductive base layer 222 and an insulating top layer 224 that encloses an internal electrode 226. A vacuum pump 228 is coupled through the floor 230 of the chamber 200. The pedestal 218 is supported on a leg 232 that is coupled to a lift mechanism 234 that can elevate or depress the level of the pedestal 218. In one implementation, the lift mechanism 234 provides a wafer-to-ceiling gap range from about 0.3 inch to about 6 inches. The wafer is clamped onto the pedestal by applying a D.C. clamping voltage from a D.C. supply 236 to the electrode 226. D.C. supply 236 typically includes a low-pass filter to isolate the DC supply from the RF voltage present on the electrode 226. RF bias power may be coupled directly to the internal electrode 226, or indirectly through the conductive base layer 222. Pedestal 218 typically includes a conductive ground housing 217 that is typically isolated from conductive base layer 222 and internal electrode 226 by an insulating material such as quartz, ceramic or plastic. Alternatively, conductive base layer 218 may be grounded.

The uniformity of the plasma ion radial distribution across the chamber 200 is controlled by providing a pair of VHF plasma source power generators 240, 242. In one aspect, the RF generator 240 has a frequency in the upper portion of the VHF range, on the order of between 110 and 250 MHz, and nominally about 162 MHz, while the other RF generator has a frequency in the lower portion of the VHF range, on the order of about 40-90 MHz, and nominally about 60 MHz. We have discovered that the higher VHF frequency from the generator 240 (if applied alone) tends to produce a plasma ion density radial distribution that is center high and edge low, while the lower VHF frequency from the generator 242 (if applied alone) tends to produce a plasma ion density radial distribution that is center low and edge high. In this respect, the two generators complement one another when used simultaneously. In one embodiment, the output power of one of the generators 240, 242 are adjusted with respect to the one another to change the plasma ion density radial distribution between a center low pattern and a center high pattern. A selection of the ratio of the RF power (or voltage or current) levels of the two generators 240, 242 is made to minimize the center high and center low non-uniformities and establish a more nearly uniform plasma ion distribution that is approximately free of both types of non-uniformities, and therefore nearly or substantially uniform. Such uniformity may be determined by measuring the radial distribution of etch rate across a wafer or workpiece. The variance of this distribution decreases as uniformity increases. The variance for a more uniform radial distribution of etch rate may be as low as 4% or less, for example.

In one embodiment, the higher VHF frequency generator 240 is coupled to the ceiling electrode 204 through an impedance match network 244 that may be either fixed or dynamic and may be either formed of lumped or distributed elements. The lower VHF frequency generator 242 is coupled to the ceiling electrode 204 through an impedance match network 246 that is formed of either lumped or distributed elements and may be either fixed or dynamic. The output of the high VHF match 244 is protected from the output of the low VHF generator 242 by a notch filter 248 tuned to block a narrow band centered around the frequency f2 of the low VHF generator 242, or alternatively by a high-pass filter tuned to block the frequency f2 of the low VHF generator 242. The output of the low VHF match 246 is protected from the output of the high VHF generator 240 by a notch filter 250 tuned to block a narrow band centered around the frequency f1 of the high VHF generator 240, or alternatively by a low-pass filter tuned to block the frequency f1 of the high VHF generator 240. The filter circuits are designed in accordance with conventional practice in conjunction with the matching networks so as to achieve the desired matching range with the required frequency isolation.

Two RF ground return paths are provided for each of the VHF frequencies f1, f2. A path along the side of the chamber 200 is provided by grounding the side wall 202, as indicated in the drawing. VHF current along this path promotes an edge-high center low plasma ion radial distribution, or at least a less center-high plasma ion radial distribution relative to an RF ground return path through the center of the chamber. A path through the center of the chamber 200 is optionally provided by coupling the pedestal electrode 226 (or the base layer 222) to ground through respective tunable (variable) bandpass filters 252, 254 which are controlled independently of one another. The variable bandpass filter 252 has a narrow pass band that includes (or is centered at least approximately on) the frequency f1 of the higher VHF generator 240. The variable bandpass filter 254 has a narrow pass band that includes (or is centered at least approximately on) the frequency f2 of the lower VHF generator 242. Both bandpass filters 252, 254 provide respective impedances to ground at their respective bandpass frequencies f1, f2. These impedances are varied by a controller 270 to determine the division of RF current from each generator 240, 242 between the pedestal electrode 226 and the side wall 202. The apportionment of this current is controlled by varying the reactance of each bandpass filter 252, 254. Conventional RF filter circuits of capacitive and inductive components may be employed to implement the variable bandpass filters 252, 254. In accordance with conventional practice, these filters may be implemented as lumped elements of capacitive and inductive components or as distributed elements, such as coaxial tuning elements or stubs. For example, FIG. 1B is a simplified schematic diagram of a variable bandpass filter of the type that can be employed in the reactor of FIG. 1A. The variable bandpass filter of FIG. 1B can include a shunt capacitor 256, an inductor 258 and a load capacitor 260, either or both capacitors 256, 260 being variable. In accordance with one aspect, the filters 252, 254 may not necessarily be bandpass filters or have the frequency response of a bandpass filter. For example, one or both of the filters 252, 254 may be a high pass filter or a low pass filter, or a reactive element whose response can be varied to function as any type of filter. Alternatively, an RF ground return path through the center of the chamber 200 may be provided by grounding the pedestal electrode 226. This may be through a high-pass filter to permit effective isolation of the RF bias.

RF bias power is applied to the ESC electrode 226, including LF power (e.g., about 2 MHz) from a low frequency RF power generator 262 through an LF impedance match 264, and HF power (e.g., about 13.56 MHz) from a high frequency RF power generator 266 through an HF impedance match 268. Typically, the RF bias frequencies are selected such that the LF power level controls the peak ion energy, while the HF power level controls the central width of the ion energy distribution. An RF current ground path may be provided for each of the RF bias sources applied to the ESC electrode 226. A path through the ceiling 204 is optionally provided by coupling the ceiling through a bandpass or low-pass filter to ground. Furthermore, a variable reactance may be inserted in the path to allow control of the bias return current to the ceiling relative to bias return current to other surfaces, namely current to the wall 202 and ring 219. The insertion reactance or impedance may be increased to force more bias return current to the edge (ring 219 or wall 202), which tends to favor an edge high plasma ion density uniformity condition. Alternatively, the insertion reactance or impedance may be decreased to force less bias return current to the edge (ring 219 or wall 202), which tends to favor a center high plasma ion density uniformity condition.

The two VHF source power generators 240, 242 may be operated in continuous wave (CW) mode or they may be pulsed synchronously or asynchronously with respect to one another. Moreover, either or both of the bias power generators 262, 266 may be operated in CW mode or in a pulsed mode. In the pulsed mode, their duty cycles may be controlled to control the time-averaged RF bias power or voltage (and therefore the ion energy) at the wafer surface. The pulsing of the bias generators 262, 266 may be synchronous or asynchronous with respect to each other and/or with respect to the source power generators 240, 242. In the pulsed mode, any pair of the foregoing generators that are pulsed synchronously to one another may have their RF envelopes coincident in time or offset in time and may be overlapping or non-overlapping.

Uniformity of gas flow across the surface of the wafer 220 and uniformity of the RF field near the wafer edge can be improved by providing a below-wafer ground return 219 extending radially outwardly from the side of the pedestal 218 at a level that is below the wafer support surface of the pedestal 218. The below-wafer ground return 219 is typically shaped as a cylinder or a flat annular ring that extends toward the side wall 202 to form a gap 203 that partly constricts gas flow from the process region above the wafer into the pumping annulus below the wafer evacuated by the vacuum pump 228. The level of the below-wafer ground return is above features such as the wafer slit valve 229 or pumping port that produces undesirable asymmetries in the plasma distribution arising from asymmetries in gas flow pattern or electrostatic or electromagnetic fields. The narrow gap between the side wall and the outer edge of the below-wafer ground return 219 partially constricts gas flow, such that the region above the wafer 220 is fairly immune to such asymmetries, thereby improving process uniformity. In one implementation, the below-wafer ground plane 219 is formed of a conductive material and is connected to ground. It therefore provides a more uniform ground reference at the wafer edge that renders the electric field more uniform there and less susceptible to asymmetries in the distribution of conductive surfaces in the chamber interior. The ring 219 may also serve as a plasma boundary to help confine the plasma volume to the chamber region above the ring 219. In an alternative implementation, the ring 219 does not serve as a ground plane, and is instead formed of a non-conductive material. In another alternative implementation, the ground return ring (or cylinder) 219 is at the workpiece or wafer level or above workpiece level. It may be at or near the ceiling level and concentrically surround the ceiling electrode 204. In another embodiment, the level of the ground return ring 219 may be selectively adjusted relative to the workpiece level with a lift mechanism. For example, by attaching the ring 219 to the outside of the pedestal 218, the ring 219 is lifted up and down by the pedestal lift mechanism. The ground return ring 219 may be insulated from other grounded surfaces in the chamber (such as the ESC base layer 224) so as to not be directly coupled to ground, and instead be coupled to ground through a variable reactive element (e.g., the variable filter 252). In this case, the ground return ring 219 serves as the edge ground return path for the VHF frequency f2. The height of this edge ground return path is therefore variable and serves as one of the adjustable parameters of the reactor.

A uniformity controller 270 controls the relative power output levels of the two VHF generators 240, 242 and optionally of the impedances of the variable bandpass filters 252, 254. The controller 270 can set the impedance of the high VHF frequency (f1) bandpass filter so as to provide a lower impedance return path to ground through the wafer 220 than the through the side wall 202 at the higher VHF frequency f1, so that the power from the f1 generator 240 produces a more pronounced center high radial distribution. Furthermore, the controller 270 can set the impedance of the low VHF frequency (f2) bandpass filter so as to provide a higher impedance return path to ground through the wafer 220 than through the side wall 202 at the lower VHF frequency f2, so that power from the f2 generator 242 produces a more pronounced center low and edge high radial distribution. The controller 270 apportions the relative power output levels of the high and low VHF frequency generators 240, 242 to either suppress a center high non-uniformity in etch rate distribution (by increasing the power output of the lower VHF frequency generator 242) or suppress an edge high non-uniformity in etch rate distribution (by increasing the power outer of the higher VHF frequency generator 240). The controller 270 may make such adjustments in response to non-uniformity patterns measured on a previously-processed wafer by a downstream or in-line metrology tool 272. During the processing of successive wafers, standard feedback control corrective techniques, implemented as programmed algorithms in the controller 270, may be employed to enact successive corrections by the uniformity controller 270 to minimize non-uniformities in etch rate distribution sensed by the metrology tool 272. The metrology tool 272 may be programmed to inform the controller 270 whether plasma ion density distribution has a predominantly center-high non-uniformity or a predominantly edge-high non-uniformity. Alternatively, the metrology tool 272 may embody in-situ sensors may provide real-time signals to the controller 270. OES (optical emission spectroscopy) sensors may be placed on the ceiling 204 at various radii, providing an indication of radial plasma excited species density. The plasma itself may be used as the light source, or external light sources may be used. Alternatively, interferometry sensors may be placed on the ceiling 204 at various radii, providing an indication of workpiece film thickness rate of change as a function of radius. Alternatively, ion flux sensors may be placed on the ceiling 204 at various radii, providing an indication of radial plasma ion density. Alternatively, voltage sensors may be placed on the ceiling 204 at various radii, providing an indication of radial electrode voltage. Alternatively, isolated voltage sensors may be placed on the ceiling 204 at various radii, providing an indication of radial plasma floating potential. Real-time control of plasma uniformity may be performed by controller 270 using sensor input and conventional techniques.

The uniformity controller can also control the lift mechanism 234, in order to provide another control dimension for improving uniformity of plasma ion distribution (or uniformity of etch rate distribution). By raising the pedestal 218 toward the ceiling electrode 204, the wafer-to-ceiling gap is decreased, which suppresses plasma ion density near the center of the wafer and promotes plasma ion density near the wafer edge. Conversely, by lowering the pedestal 218 away from the ceiling electrode 204, the wafer-to-ceiling gap is increased, which promotes plasma ion density over the wafer center while detracting from plasma ion density at the wafer edge. Thus, the plasma distribution may be rendered more center-high or more center-low by raising or lowering the pedestal 218, respectively. As discussed above, the plasma distribution may be rendered more center-high or more center-low by increasing or decreasing, respectively, the ratio of the higher VHF frequency power to lower VHF frequency power. Thus, the pedestal height and the VHF power ratio are two different controls that affect the plasma ion distribution. The uniformity controller 270 can employ both of these controls simultaneously to optimize plasma ion distribution uniformity. For example, an edge-high plasma non-uniformity may be reduced by increasing the output power of the higher VHF frequency generator 240, which may tend to increase a center-high peak in plasma ion distribution. This increase in the center-high peak may be suppressed, without requiring further change in the VHF power apportionment, by raising the pedestal 218 to decrease the wafer-ceiling gap until an optimum plasma distribution is realized. This may be useful for process recipes calling for a low RF bias and a low chamber pressure, in which case the center-high peak in plasma ion distribution is particularly pronounced. The control of both VHF frequency apportionment together with control of the wafer-ceiling gap extends the range of non-uniformity that the controller 270 is capable of counteracting. For a severe center-high nonuniformity, for example, the controller 270 may call for both an increase in the higher-versus-lower VHF frequency power apportionment as well as a narrower wafer-ceiling gap.

The variable wafer-to-ceiling gap affects where a particular VHF frequency (e.g., f1 or f2) has a peak in non-uniform plasma ion density distribution. Therefore, the controller 270 can set the gap to optimize the choice of f1 to produce a predominantly center-high non-uniform plasma ion density distribution and the choice of f2 to produce a predominantly edge-high non-uniform plasma ion density distribution. For example, the controller 270 sets the wafer-ceiling gap to optimize the choice of f1 and f2 to produce the different non-uniformity patterns, and the controller 270 varies the ratio of RF power (or current or voltage) at the different frequencies f1, f2 to control the plasma ion distribution and reduce its non-uniformities.

The controller 270 may respond to an indication from the metrology tool 272 of a predominantly center-high or edge-high non-uniformity in plasma ion density distribution by measuring and controlling (changing) any one of the following so as to tend to reduce that non-uniformity: (a) the ratio of RF voltages at the frequencies f1, f2; (b) the ratio of RF currents at the frequencies f1, f2; or (c) the ratio of RF power at the frequencies f1, f2. Such measurements may be made at the respective electrodes, for example, or another suitable location.

In one alternate mode, the controller 270 varies plasma ion density distribution without necessarily changing the apportionment of power among the higher (f1) and lower (f2) VHF generators 240, 242. Instead, plasma ion density distribution is changed by the controller 270 by varying the impedances to the center ground return paths presented by the f1 and f2 variable bandpass filters 252, 254. For example, the tendency of the higher frequency (f1) VHF power to create a center peak or suppress an edge peak in plasma density distribution may be increased or decreased by changing the impedance presented to the f1 power by the variable bandpass filter 252. Likewise, the tendency of the lower frequency (f2) VHF power to create an edge peak or suppress a center peak in plasma ion density distribution may be increased or decreased by changing the impedance presented to the f2 power by the variable bandpass filter 254. Such changes affect the apportionment of VHF current at each of the frequencies f1, f2 between the center ground return path (ceiling-to-wafer) and the side ground return path (through the side wall 202). By directing more of the f1 power to the center ground return path, the tendency of the higher VHF frequency (f1) power to create a center-high distribution is increased. By directing more of the f2 power to the side ground return path, the tendency of the lower VHF frequency (f2) power to create an edge-high distribution is increased. In some cases, the controller may change the ground return path apportionment for only one of the two frequencies f1, f2.

In a further alternate mode of the reactor of FIG. 1, only one of the VHF generators (e.g., only the generator 240) provides RF power, the other generator (e.g., the generator 242) not being used or else being eliminated. The uniformity controller 270 changes the plasma ion radial distribution by varying the f1 bandpass filter 252 so as to control the impedance of the ground return path through the ESC electrode 226. This apportions the ground return currents between the center path through the ESC electrode 226 and the side path through the side wall 202. As a result, this feature of the controller 270 varies the center-high and center-low non-uniformities in plasma ion distribution (or equivalently in etch rate distribution) to optimize uniformity.

While only two VHF generators 240, 242 are illustrated in FIG. 1A, more VHF generators may be employed of different frequencies. For example, a third VHF generator may be employed having a frequency higher than either of the two VHF generators 240, 242. As described above, the high VHF frequency generator (e.g., 162 MHz) produces a center peak in plasma ion distribution while the lower frequency generator 242 (60 MHz) produces an edge peak. Uniformity may be improved by introducing a third VHF generator having an even higher frequency that produces peaks between the center and edge that fill in the minima in the plasma ion density radial distribution.

The reactor of FIG. 1A may be used to reproduce plasma process conditions characteristic of a very low density bias-only plasma conventionally produced with a single HF (13.56 MHz) frequency source to both generate plasma ions and control the bias voltage on the wafer. This simulation may be realized by applying only an LF (e.g., 2 MHz) bias power from the generator 264, and setting the output power of each of the two VHF generators 240, 242 to a very low level (e.g., 10 Watts) to establish the low plasma ion density desired. The advantage of this is that the two generators 240, 242 may be adjusted with very fine changes in output power to maintain plasma uniformity over a far wider range of changing process conditions than would be achievable with a single HF (13.56 MHz) frequency source.

Figure 2:
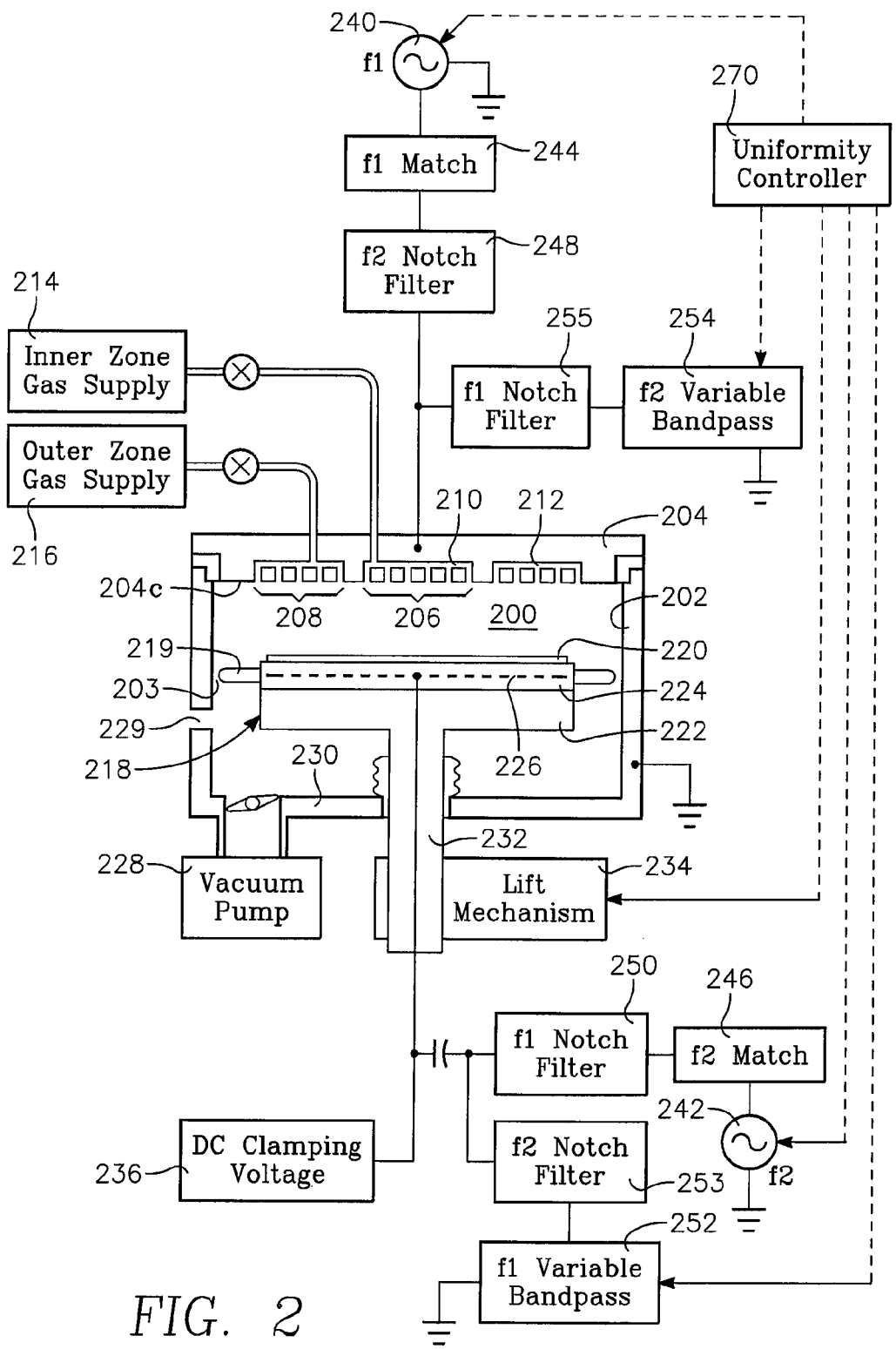
FIG. 2 illustrates a plasma reactor having different VHF frequencies applied to opposing electrodes.

FIG. 2 depicts a modification of the reactor of FIG. 1A, in which the lower VHF frequency (f2) generator 242 and its match 246 and notch filter 250 are coupled to the ESC electrode 226 rather than the ceiling electrode 204. In this case, the f2 ground return path is through the ceiling electrode 204. Therefore, the f2 variable bandpass filter 254 is coupled to the ceiling electrode 204 rather than the ESC electrode 226. A notch filter 255 tuned to block RF current from the higher VHF frequency (f1) generator 240 may be connected to the f2 bandpass filter 254. Likewise, a notch filter 253 tuned to block RF current from the lower VHF frequency (f2) generator 242 may be connected to the f1 bandpass filter 252.

In one alternative mode of the reactor of FIG. 2, the VHF frequencies f1 and f2 applied to the top (ceiling electrode 204) and bottom (ESC electrode 226) respectively are the same frequency (f1=f2). In this case, the controller 270 varies radial distribution of ion density (or etch rate) by varying the phase between the voltages (or currents) at the ceiling electrode 204 and the ESC electrode 226. The phase between the currents at the ceiling electrode 204 and the ESC electrode 226 may be controlled, for example, by varying the reactance of the bandpass filters 252, 254. Alternatively, the phase may be controlled at one or both generators 240, 242. For example, if the reactances of the bandpass filters 252, 254 are the same (and if there are no other differences), then the phase angle between the RF currents at the ceiling and ESC electrodes 204, 226 is zero. At a phase of 180 degrees, essentially all of the current flows between the ceiling electrode 204 and the ESC electrode 226, generating a center-high distribution of plasma ion density or etch rate. At a phase of zero degrees, essentially all of the current flows from either the ceiling electrode 204 or the ESC electrode 226 to the side wall 202, generating a center-low edge-high distribution. Therefore, the controller 270 can vary the phase angle between 0 and 180 degrees to attain a wide range of results.

In another alternate mode of the reactor of FIG. 2, only one of the VHF generators (i.e., only the f2 generator 242) provides RF power, the other generator 240 not being used or else being eliminated. The uniformity controller 270 changes the plasma ion radial distribution by varying the f2 bandpass filter 254 so as to control the impedance of the ground return path through the ceiling electrode 204, so that it increases or decreases relative to the (fixed) impedance of the ground return path through the side wall 202. This apportions the ground return current between the center path through the ceiling electrode 204 and the side path through the side wall 202. As a result, this feature of the controller 270 varies the center-high and center-low non-uniformities in plasma ion distribution (or equivalently in etch rate distribution) to optimize uniformity.

In yet another alternate mode of the reactor of FIG. 2, only one of the VHF generators (i.e., only the f1 generator 240) provides RF power, the other generator 242 not being used or else being eliminated. The uniformity controller 270 changes the plasma ion radial distribution by varying the f2 bandpass filter 252 so as to control the impedance of the ground return path through the ESC electrode 226, so that it increases or decreases relative to the (fixed) impedance of the ground return path through the side wall 202. This apportions the ground return current between the center path through the ESC electrode 226 and the side path through the side wall 202. As a result, this feature of the controller 270 varies the center-high and center-low non-uniformities in plasma ion distribution (or equivalently in etch rate distribution) to optimize uniformity.

Figure 3A:
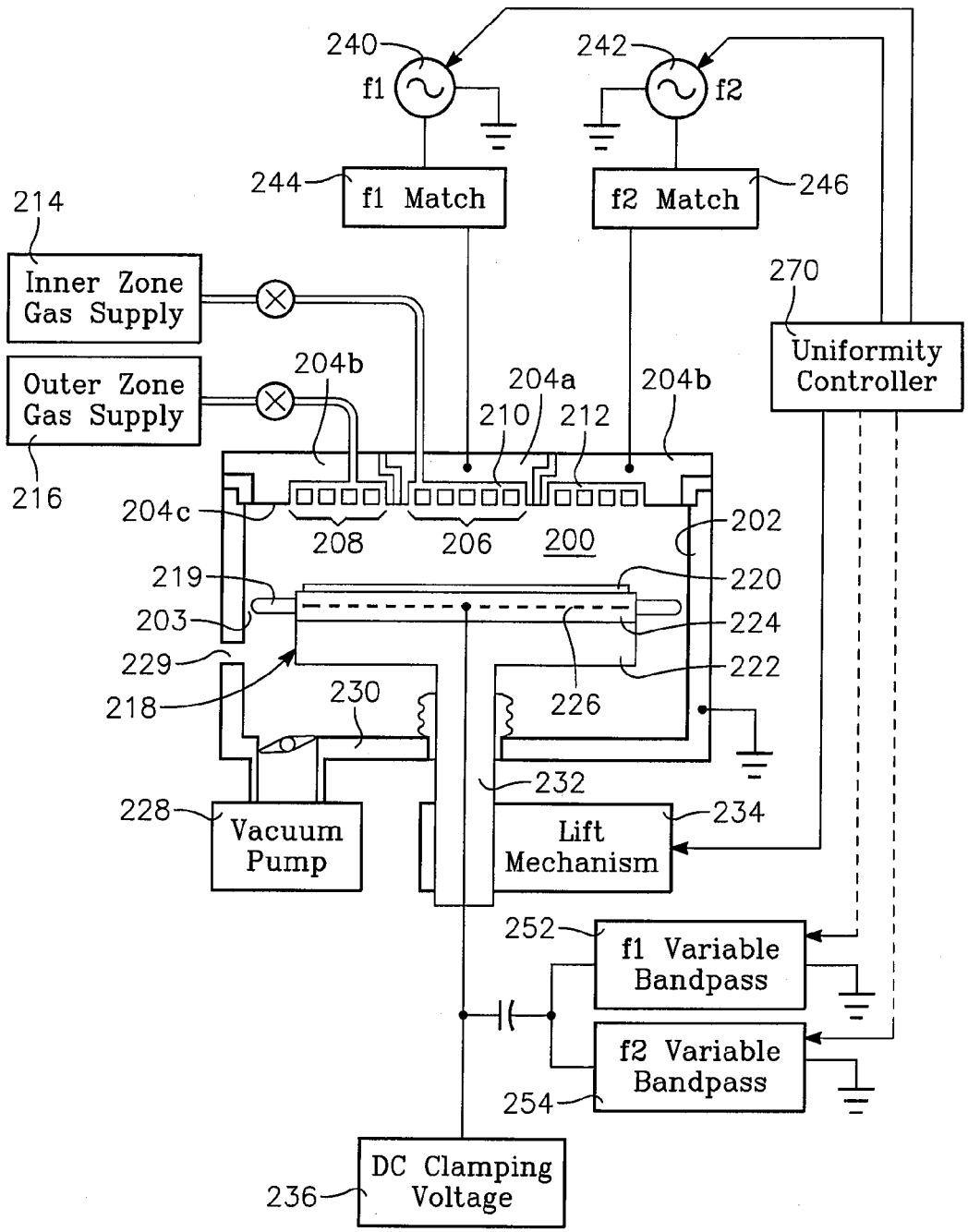
FIGS. 3A and 3B illustrate a plasma reactor with different VHF frequencies applied to respective concentric electrodes.
Figure 3B:
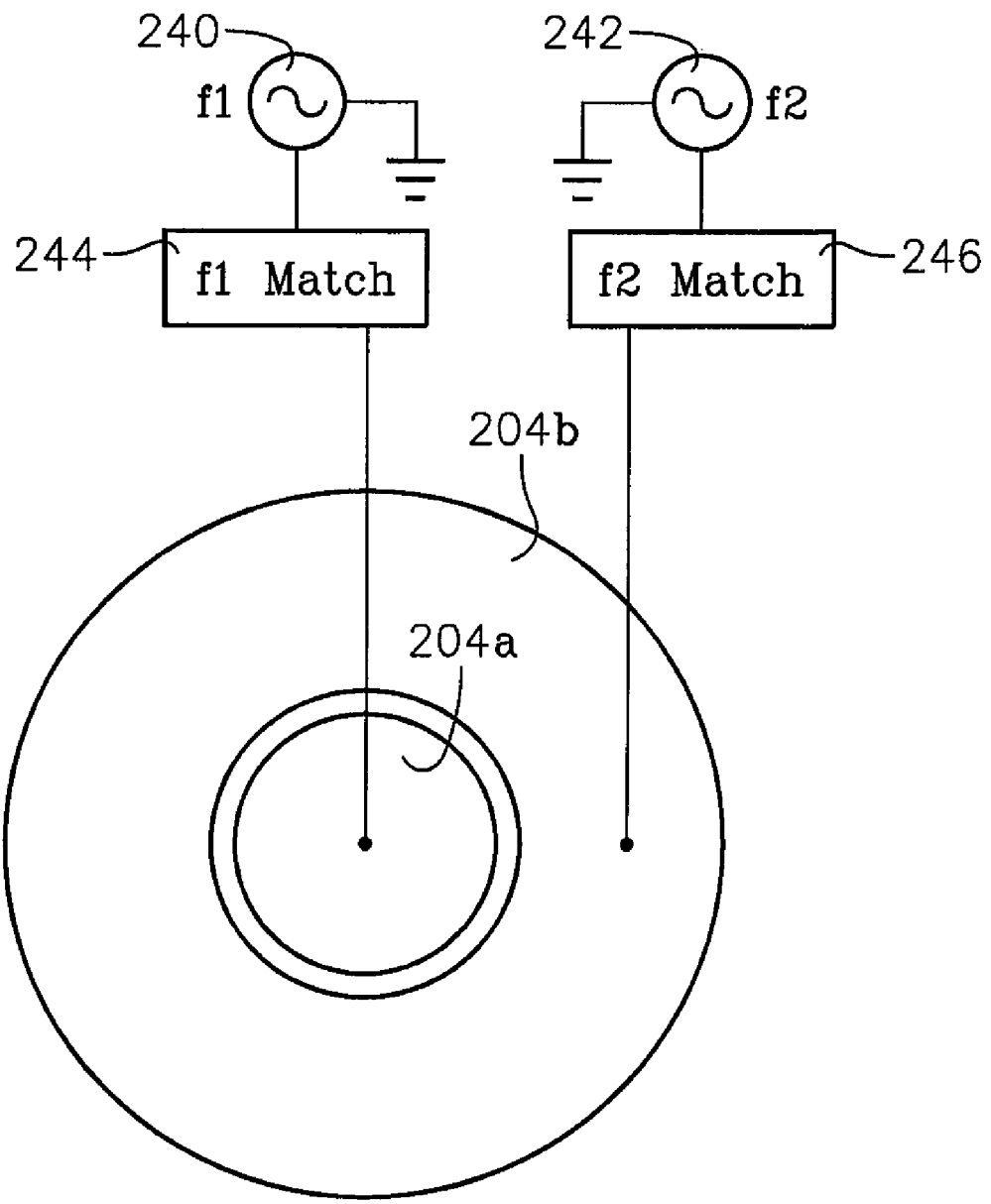

FIGS. 3A and 3B depict a modification of the reactor of FIG. 1 in which the ceiling electrode 204 is divided into radially inner and outer sections 204a, 204b that are electrically isolated from one another, and separately driven by respective ones of the generators 240, 242. While either generator may be selected to drive the inner electrode 204a leaving the other to drive the outer electrode 204b, it is preferred that the higher VHF frequency generator 240 be coupled to the inner electrode 204a and the lower VHF frequency generator 242 be coupled to the outer electrode 204b, in order to enhance the tendency of the higher frequency to develop a center-high ion distribution and enhance the tendency of the lower frequency to develop a center-low ion distribution.

Figure 4:
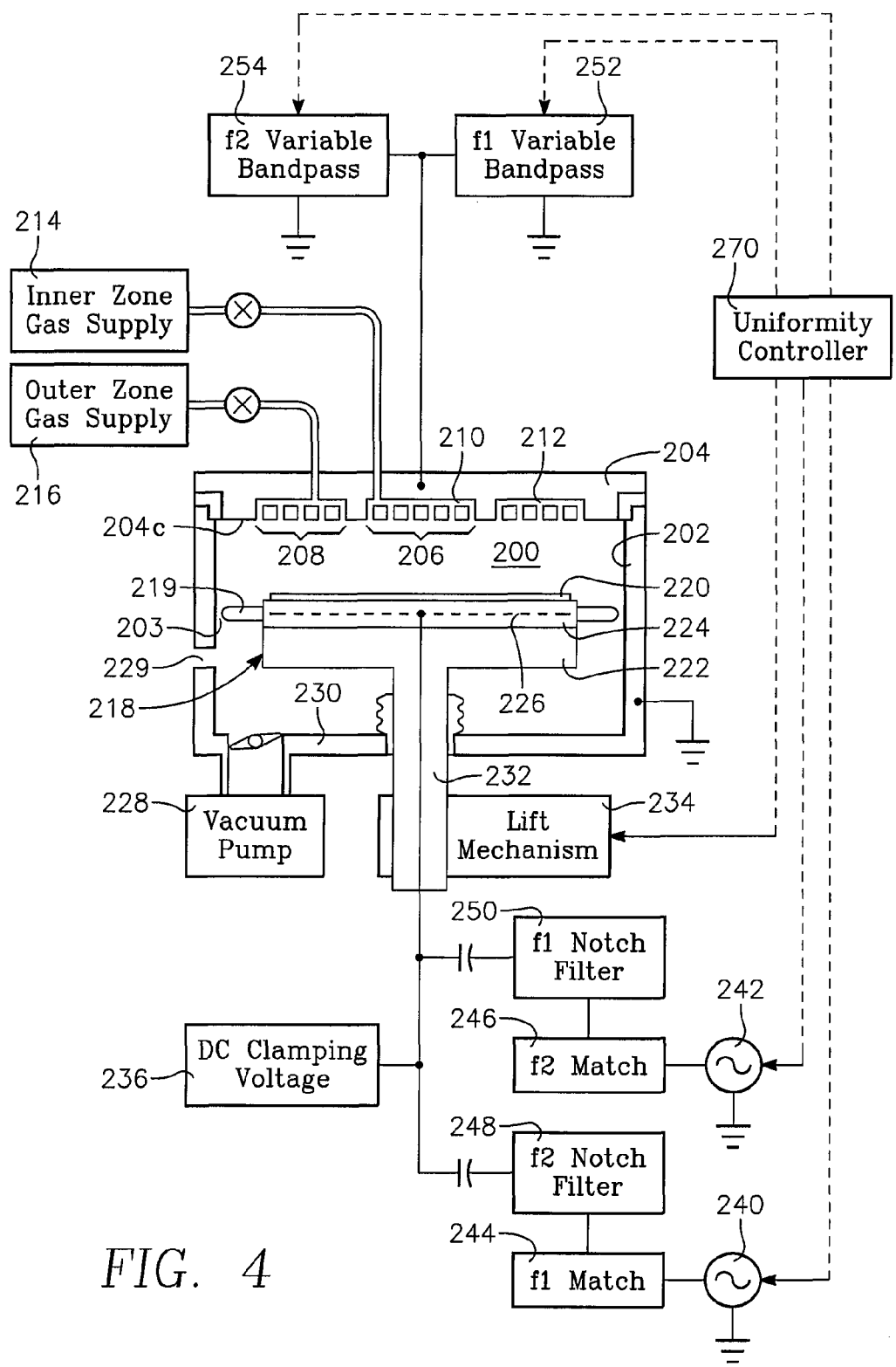
FIG. 4 illustrates a plasma reactor with different VHF frequencies applied to the cathode electrode.

FIG. 4 depicts a modification of the reactor of FIG. 1 in which both the VHF generators 240, 242 drive the ESC electrode 226 while the ground return bandpass filters 252, 254 are coupled to the ceiling electrode 204.

Figure 5:
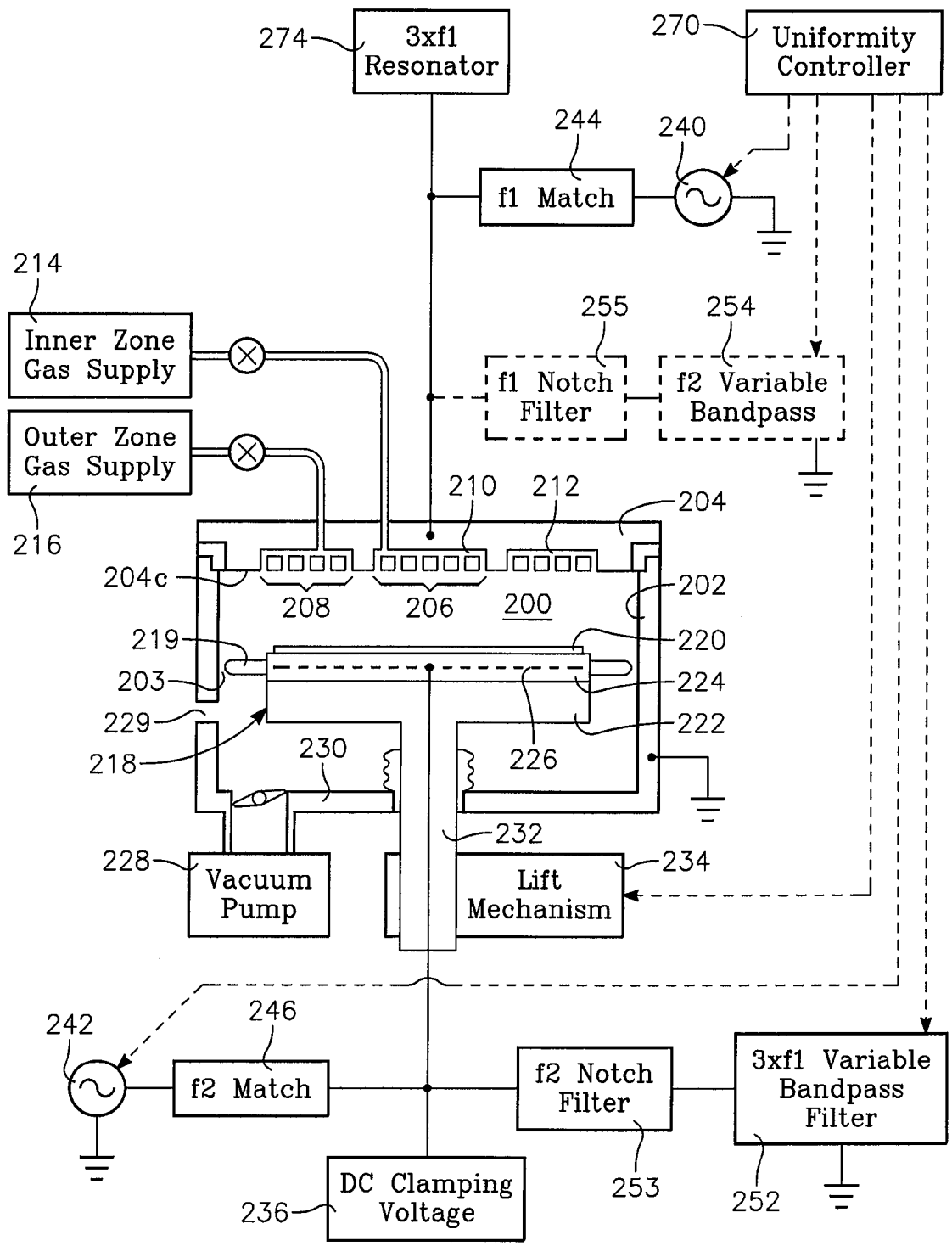
FIG. 5 illustrates a plasma reactor with two VHF source power frequencies, in which the high VHF source power frequency is produced using a low VHF frequency generator and a third harmonic resonator.

FIG. 5 depicts a modification of the reactor of FIG. 2, in which the two frequencies f1 and f2 are both in the lower portion of the VHF band. For example, f1 and f2 may be 54 MHz and 60 MHz, respectively. This represents a significant cost savings by eliminating the need for a high VHF frequency generator having an output frequency near 200 MHz or over 150 MHz. In the reactor of FIG. 5, the missing high VHF frequency (e.g., 162 MHz), that provides the center-high response, is produced with a high VHF frequency (e.g., 162 MHz) resonator 274 coupled to the ceiling electrode 204 (or alternatively to the output of the f1 generator 240). Preferably, the resonator 274 is tuned to resonate at an odd harmonic of f1, such as the third harmonic. For example, if f1=54 MHz, then the third harmonic generated in the resonator 274 would be 162 MHz. Production of the higher harmonic is facilitated by the non-linear response of the plasma in the reactor chamber that functions as a frequency multiplier in cooperation with the resonator 274. The variable bandpass filter 252 is tuned to the third harmonic of f1 so that some of the RF power at f1 from the generator 240 is converted to the third harmonic of f1.

In another alternate mode of the reactor of FIG. 5, only one of the VHF generators (i.e., only the generator 240) provides RF power, the other generator 242 not being used or else being eliminated. The uniformity controller 270 changes the plasma ion radial distribution by varying the f1 bandpass filter 252 so as to control the impedance of the ground return path through the ceiling electrode 204, so that it increases or decreases relative to the (fixed) impedance of the ground return path through the side wall 202. This apportions the ground return currents between the center path through the ceiling electrode 204 and the side path through the side wall 202. As a result, this feature of the controller 270 varies the center-high and center-low non-uniformities in plasma ion distribution (or equivalently in etch rate distribution) to optimize uniformity.

Figure 6:
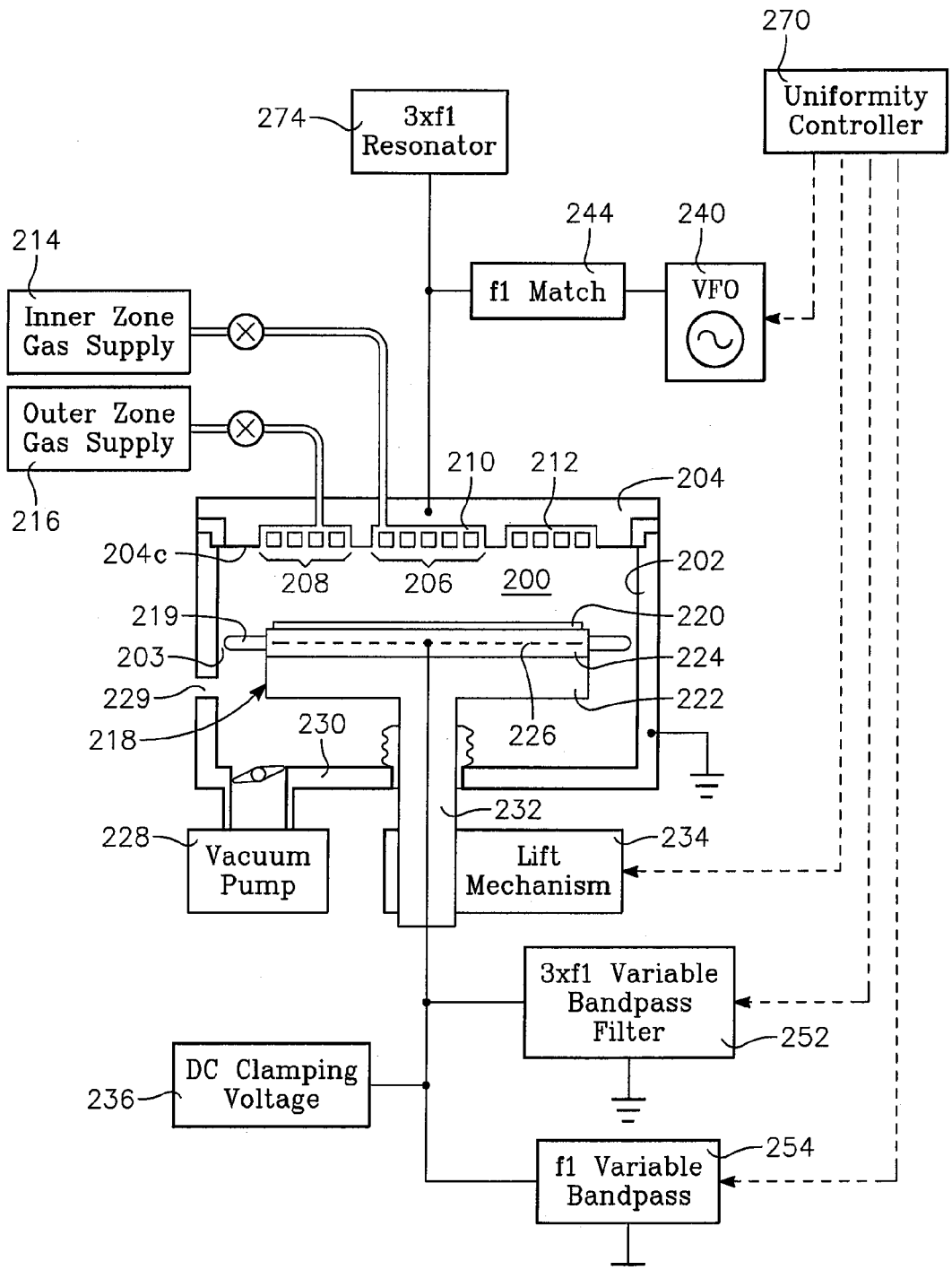
FIG. 6 illustrates a plasma reactor with a single VHF variable frequency generator in the low portion (e.g., 50-60 MHz) of the VHF band with a third harmonic resonator to produce a VHF frequency component in the high portion (e.g., over 100 MHz) of the VHF band at a power level determined by varying the generator output frequency.

FIG. 6 depicts a modification of the reactor employing simultaneous high and low VHF frequencies but employing only a single low VHF frequency generator to achieve a great cost savings. The low VHF generator 240 is a variable frequency oscillator (VFO) whose frequency is varied by the controller 270 between a fundamental frequency f and f±Δf, where Δf is a small deviation from f. The resonator 274 is tuned to the third harmonic, F=3·f, of the fundamental frequency f. By changing the frequency of the generator 240, the proportion of the output power of the generator that is converted to the third harmonic F is increased or decreased in inverse proportion to the difference between the generator output frequency f±Δf and the fundamental frequency f whose third harmonic is the resonant frequency of the resonator 274. The result is that both frequencies, i.e., the generator output frequency f±Δf and the harmonic frequency F, are coupled to the plasma, and their relative power levels are controlled by varying the output frequency of the generator 240. By decreasing the difference between the generator output frequency and the fundamental frequency f, the power coupled to the plasma at the third harmonic increases while the power at the fundamental, f, decreases, thereby increasing the center-high non-uniformity or decreasing the edge-high non-uniformity. Conversely, by increasing the difference between the generator output frequency and the fundamental frequency f, the power coupled to the plasma at the third harmonic decreases while the power at the fundamental, f, increases, thereby increasing the edge-high non-uniformity or decreasing the center-high non-uniformity. Therefore, plasma uniformity is regulated by the controller 270 by varying the frequency of the VFO or generator 240. The two variable bandpass filters 252, 254 have passbands centered at, respectively, the fundamental, f, and the third harmonic, F.

In one aspect, the interior chamber elements are formed of a metal such as aluminum. In order to prevent or minimize metal contamination during plasma processing, the surfaces of the metal chamber elements that can be exposed to plasma, such as the interior surface of the side wall 202 and the exposed surfaces of the pedestal 218, are coated with a film of a process-compatible material, such as yttria, for example. The film may be a plasma-spray-coated yttria. Alternatively, bulk ceramic material such as yttria may be bonded to underlying metal interior chamber elements. For example, the ceiling 204 may have a bonded ceramic plate on the side exposed to plasma. The sidewall 202 may include a bonded ceramic cylinder on the side exposed to plasma, or the ring 219 may include a bonded ceramic ring on the side exposed to plasma. Ceramic materials may be doped or otherwise fabricated such that their electrical resistivity is in the semiconducting range (e.g., resistivity in the range $10^8$ to $10^{12}$ ohm*cm) to provide a DC current return path for the ESC clamping voltage applied to the ESC electrode 226. These chamber surfaces may be heated in order to minimize undesired deposition or accumulation of materials such as polymers, for example, or cooled to minimize or eliminate etching, or temperature controlled employing both heating and cooling. The interior surfaces of the chamber may be cleaned in a plasma etch process by employing an appropriate chemistry. For example, in a dry cleaning step, oxygen or oxygen-containing, or chlorine or chlorine-containing gas may be introduced into the chamber and a plasma may generated using the VHF source power generators 240, 242 and/or the bias power generators 262, 266.

Figure 7:
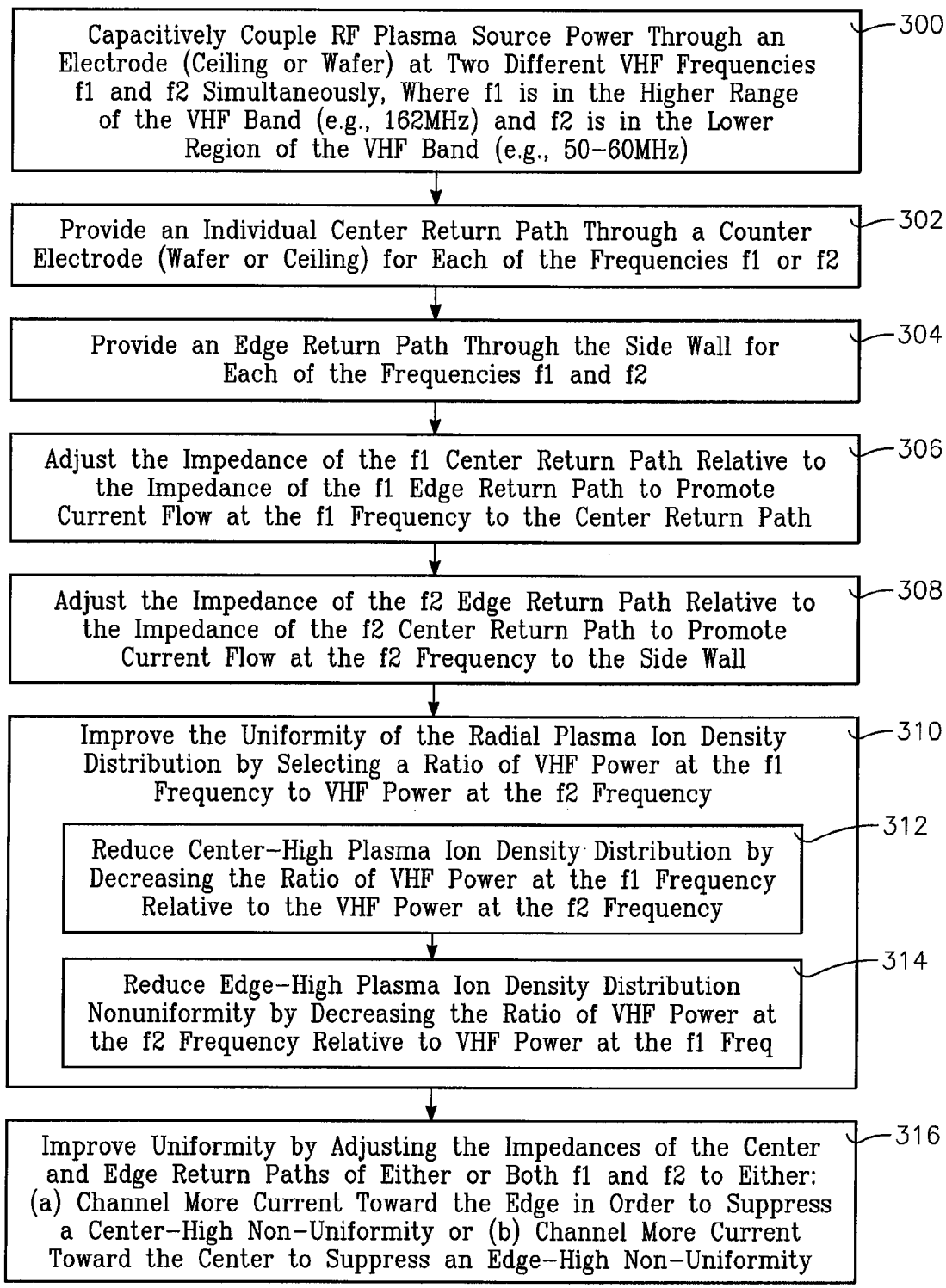
FIG. 7 illustrates a process that can be carried out using the reactor of FIG. 1.

FIG. 7 illustrates a process that can be carried out using the reactor of FIG. 1. In block 300 of FIG. 7, RF plasma source power is capacitively coupled through an electrode (ceiling or wafer) at two different VHF frequencies f1 and f2 simultaneously, where f1 is in the higher range of the VHF band (e.g., 162 MHz) and f2 is in the lower region of the VHF band (e.g., 50-60 MHz). In block 302, an individual center ground return path is provided through a counter electrode (wafer or ceiling) for each of the frequencies f1 and f2, by providing the bandpass filters 252, 254 to ground as shown in FIG. 1. In block 304 of FIG. 7, an edge return path is provided through the side wall for each of the frequencies f1 and f2 by grounding the side wall 202 as shown in FIG. 1. In block 306, the impedance of the f1 center return path is adjusted relative to the impedance of the f1 edge return path to promote current flow at the f1 frequency to the center return path, by adjusting the bandpass filter 252. In block 308, the impedance of the f2 edge return path is adjusted relative to the impedance of the f2 center return path to promote current flow at the f2 frequency to the side wall, by adjusting the bandpass filter 254. In block 310, the uniformity controller 270 improves the uniformity of the radial plasma ion density distribution by selecting a ratio of VHF power at the f1 frequency to VHF power at the f2 frequency. The step of block 310 may be carried out to reduce a center-high plasma ion density distribution by decreasing the ratio of VHF power at the f1 frequency relative to VHF power at the f2 frequency (block 312). Or, the step of block 310 may be carried out to reduce an edge-high plasma ion density distribution nonuniformity by decreasing the ratio of VHF power at the f2 frequency relative to VHF power at the f1 frequency (block 314). As another way of affecting or improving ion density distribution, the controller 270 may adjust the impedances of the center and edge return paths of either or both f1 and f2 (by adjusting the respective bandpass filters 252, 254) to either: (a) channel more current toward the edge in order to suppress a center-high non-uniformity or (b) channel more current toward the center to suppress an edge-high non-uniformity (block 316).

In this description, uniformity may be referred to with respect to radial plasma ion density distribution. It is understood that such a distribution is inferred from or is equivalent to etch rate radial distribution that can be measured across the surface of a wafer that has been processed by a plasma etch process in the reactor.

Figure 8:
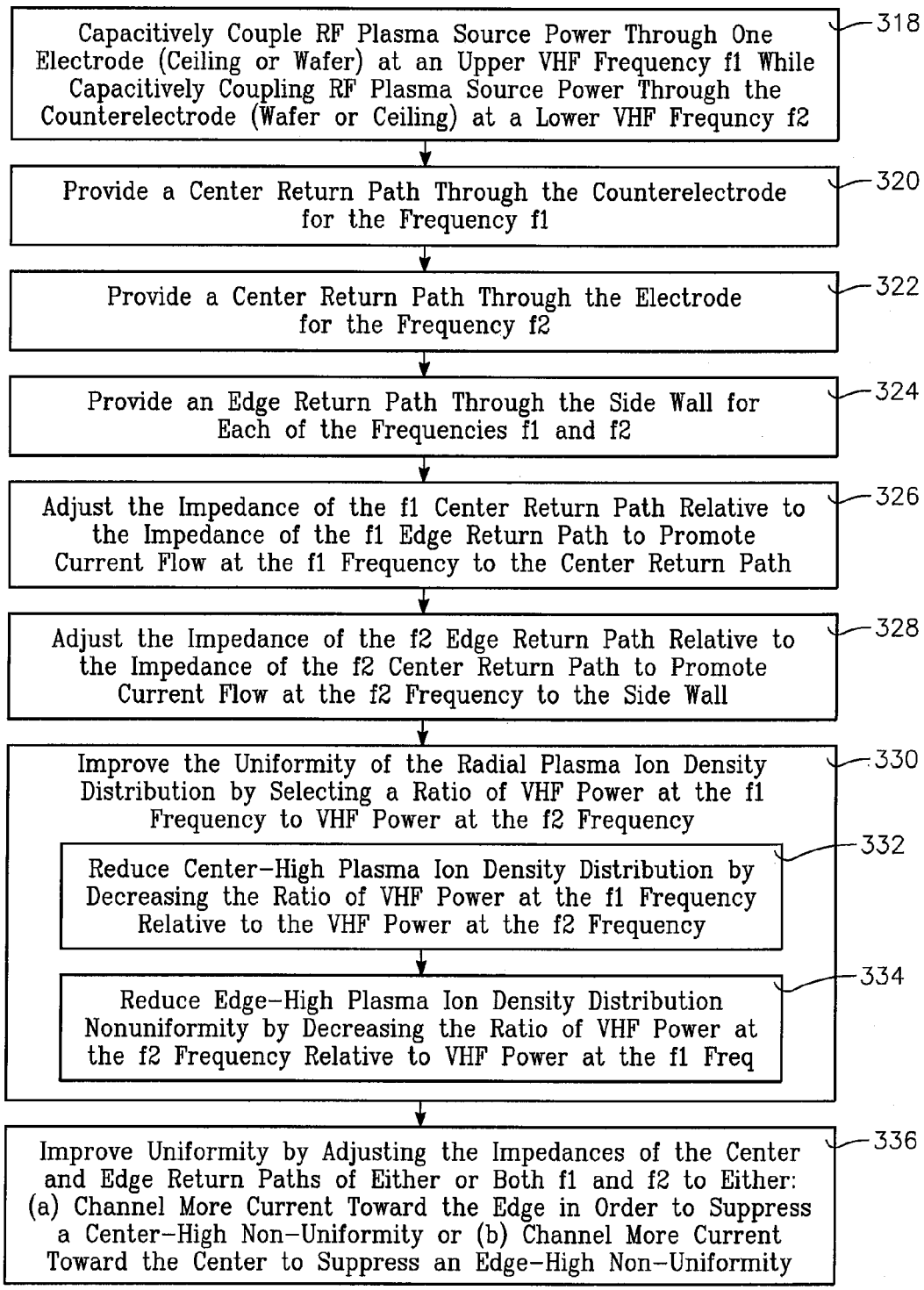
FIG. 8 illustrates a process that can be carried out using the reactor of FIG. 2.

FIG. 8 illustrates a process that can be carried out using the reactor of FIG. 2. In the step of block 318 of FIG. 8, RF plasma source power is capacitively coupled through one electrode (ceiling or wafer) at an upper VHF frequency f1 (e.g., about 162 MHz) while RF plasma source power is capacitively coupled through the counterelectrode (wafer or ceiling) at a lower VHF frequency f2 (e.g., about 50-60 MHz). In block 320, a center return path is provided through the counterelectrode for the frequency f1. In block 322, a center return path is provided through the electrode for the frequency f2. In the step of block 324, an edge return path through the side wall for each of the frequencies f1 and f2. In the step of block 326, the impedance of the f1 center return path is adjusted relative to the impedance of the f1 edge return path to promote current flow at the f1 frequency to the center return path, by adjusting the variable bandpass filter 252. In the step of block 328, the impedance of the f2 side return path is adjusted relative to the impedance of the f2 center return path to promote current flow at the f2 frequency to the side wall, by adjusting the variable bandpass filter 254. In the step of block 330, the controller 270 improves the uniformity of the radial plasma ion density distribution by selecting a ratio of VHF power at the f1 frequency to VHF power at the f2 frequency. This step may be carried out to reduce center-high plasma ion density distribution by decreasing the ratio of VHF power at the f1 frequency relative to VHF power at the f2 frequency (block 332). This step may be carried out to reduce edge-high plasma ion density distribution nonuniformity by decreasing the ratio of VHF power at the f2 frequency relative to VHF power at the f1 frequency (block 334). Alternatively or in addition to the step of block 330, the controller 270 may improve uniformity by adjusting the impedances of the center and edge return paths of either or both f1 and f2 (by adjusting the respective bandpass filters 252, 254) to either: (a) channel more current toward the edge in order to suppress a center-high non-uniformity or (b) channel more current toward the center to suppress an edge-high non-uniformity (block 336 of FIG. 8).

Figure 9:
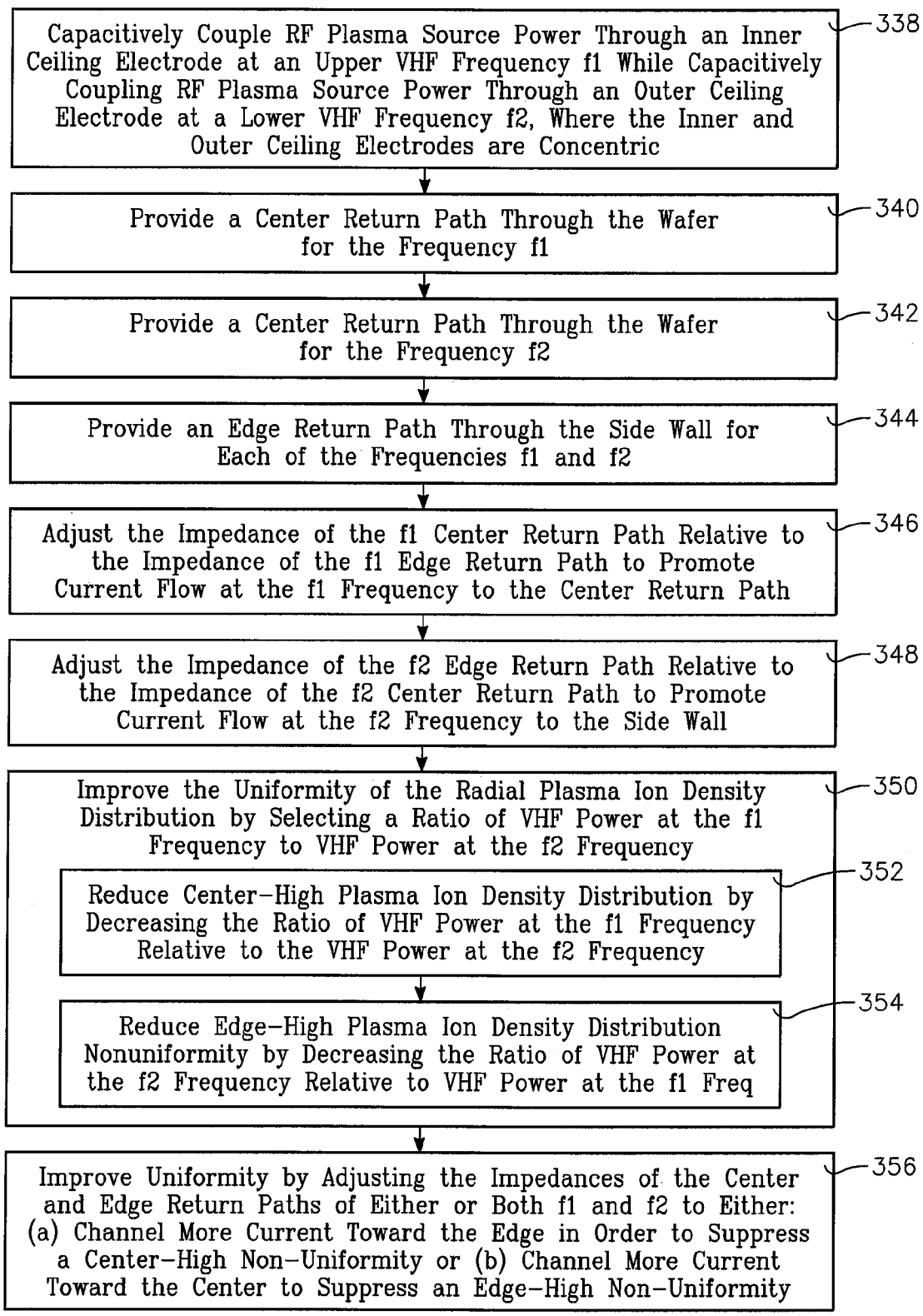
FIG. 9 illustrates a process that can be carried out using the reactor of FIG. 3A.

FIG. 9 illustrates a process that can be carried out using the reactor of FIG. 3A. In the process of FIG. 9, RF plasma source power through an inner ceiling electrode at an upper VHF frequency f1 RF plasma source power is capacitively coupled through an outer ceiling electrode at lower VHF frequency f2 (block 338 of FIG. 9). In block 340, a center return path is provided through the wafer for the frequency f1 by providing the bandpass filter 252 coupled to ground. In block 342, a center return path through the wafer is provided for the frequency f2 by providing the bandpass filter 254 coupled to ground. In block 344 of FIG. 9, an edge return path through the side wall 202 for each of the frequencies f1 and f2 by grounding the side wall 202, as shown in FIG. 3A. In the step of block 346, the impedance of the f1 center return path is adjusted relative to the impedance of the f1 edge return path to promote current flow at the f1 frequency to the center return path, by adjusting the reactance of the bandpass filter 252. In the step of block 348, the impedance of the f2 edge return path is adjusted relative to the impedance of the f2 center return path to promote larger current flow at the f2 frequency to the side wall, by adjusting the reactance of the bandpass filter 254. In block 350, the controller 270 improves the uniformity of the radial plasma ion density distribution (or of etch rate distribution on the wafer) by selecting a ratio of VHF power at the f1 frequency to VHF power at the f2 frequency. This step may be carried out to reduce a center-high plasma ion density distribution by decreasing the ratio of VHF power at the f1 frequency relative to VHF power at the f2 frequency (block 352). Or, this step may be carried out to reduce edge-high plasma ion density distribution nonuniformity by decreasing the ratio of VHF power at the f2 frequency relative to VHF power at the f1 frequency (block 354). Alternatively, or in addition to the step of block 350, the controller 270 may improve uniformity of plasma ion density distribution (or etch rate distribution on the wafer) by adjusting the impedances of the center and edge return paths of either or both f1 and f2 to either: (a) channel more current toward the edge in order to suppress a center-high non-uniformity or (b) channel more current toward the center to suppress an edge-high non-uniformity (block 356 of FIG. 9).

Figure 10:
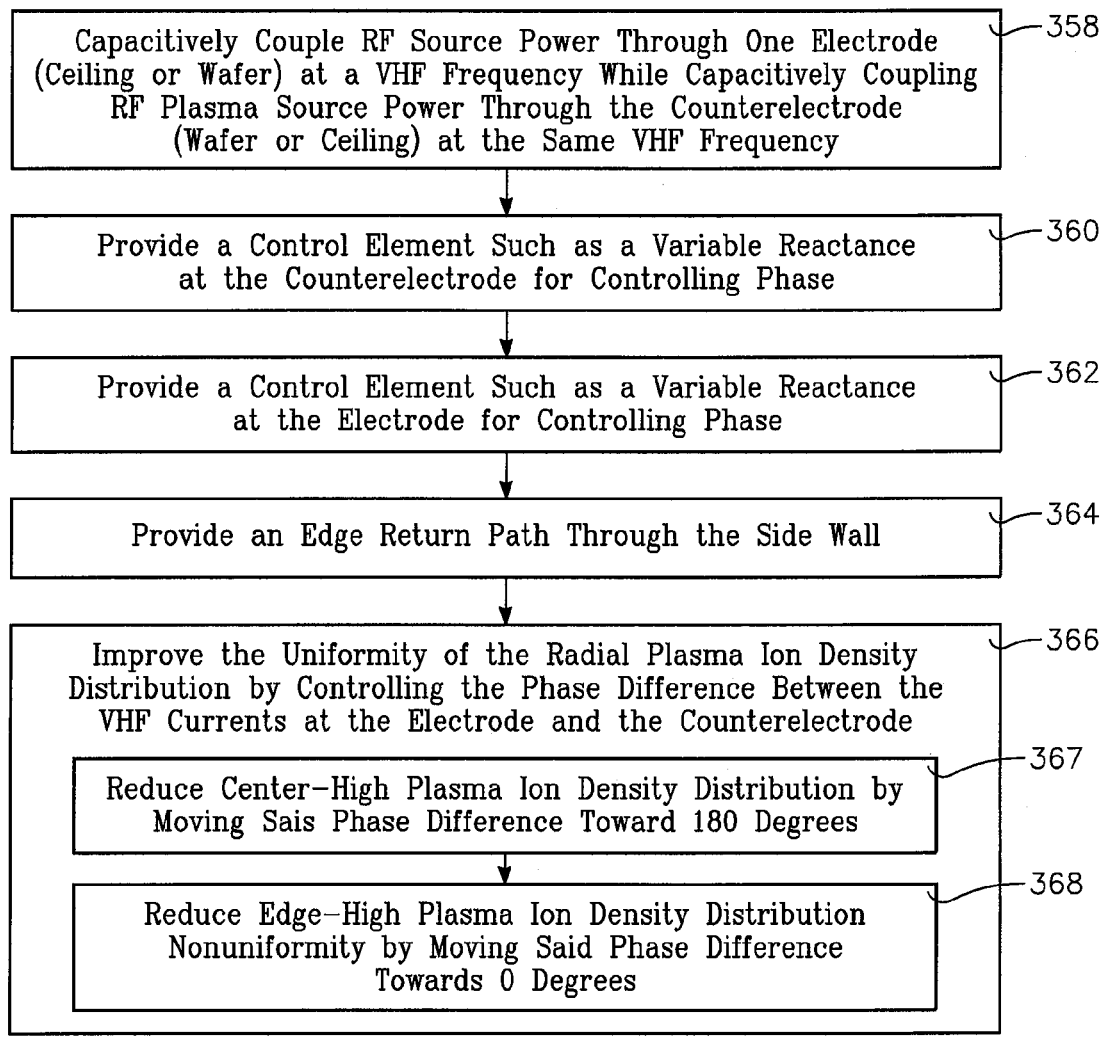
FIG. 10 illustrates a process that can be carried out in the reactor of FIG. 2 by setting the two VHF frequencies f1 and f2 of FIG. 2 equal to one another.

FIG. 10 illustrates a process that can be carried out in the reactor of FIG. 2 by setting the two VHF frequencies f1 and f2 of FIG. 2 equal to one another (or at least nearly equal to one another). The bandpass filters 252, 254 are used in this case as variable reactances that can control or vary the phase between the VHF voltages (or currents) at the ceiling and wafer. In the step of block 358 of FIG. 10, RF plasma source power is capacitively coupled through one electrode (ceiling or wafer) at a VHF frequency while capacitively coupling RF plasma source power through the counterelectrode (wafer or ceiling) at the same VHF frequency. In block 360, a control element such as a variable reactance (e.g., the variable bandpass filter 252) is provided at the counterelectrode 226 of FIG. 2 for controlling phase. In block 362, a control element such as a variable reactance (e.g., the variable bandpass filter 254) is provided at the electrode 204 for controlling phase. In the step of block 364, an edge return path is provided by grounding the side wall 202. In the step of block 366, the controller 270 improves the uniformity of the radial plasma ion density distribution by controlling the phase difference between the VHF currents at the electrode and the counterelectrode. This step may be carried out to reduce a center-high plasma ion density distribution by moving the phase difference toward 180 degrees (block 367 of FIG. 10). Or, the step of block 368 may be carried out to reduce an edge-high plasma ion density distribution nonuniformity by moving the phase difference towards 0 degrees.

Figure 11:
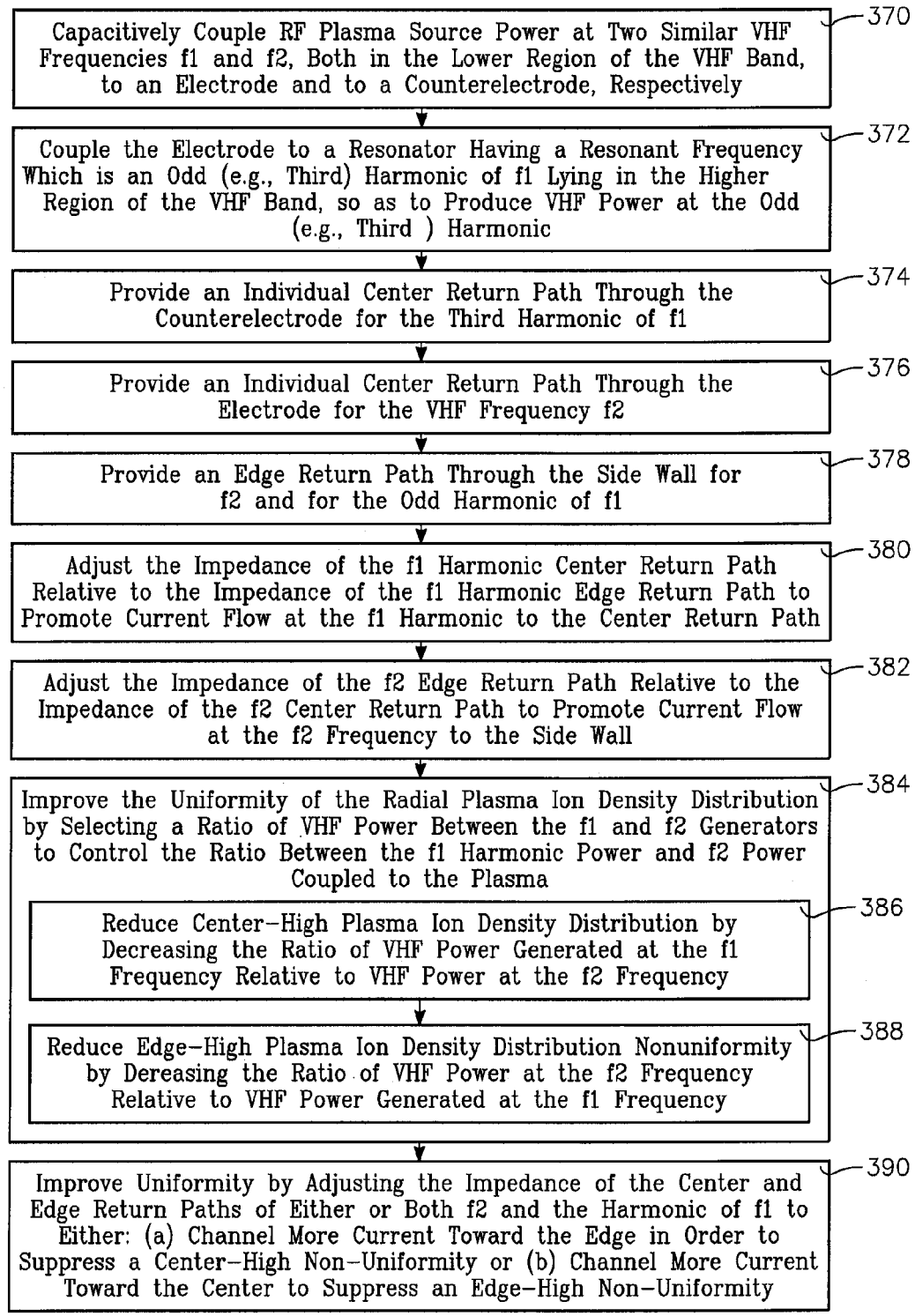
FIG. 11 illustrates a process that may be carried out using the reactor of FIG. 5.

FIG. 11 illustrates a process that may be carried out using the reactor of FIG. 5. In block 370 of FIG. 11, RF plasma source power at two similar VHF frequencies f1 and f2, both in the lower region of the VHF band, to an electrode (204 of FIG. 5) and to a counterelectrode (226 of FIG. 5), respectively. This represents a significant cost savings by eliminating the cost of a high VHF frequency (e.g., 160-200 MHz) generator. In block 372 of FIG. 11, the electrode 204 is coupled to a resonator (274 of FIG. 5) having a resonant frequency which is an odd (e.g., third) harmonic of f1, and lies in the higher region of the VHF band, so as to produce VHF power at the odd (e.g., third) harmonic (e.g., 162 MHz). In block 374, an individual center return path is provided through the counter electrode (266 of FIG. 5) for the third harmonic of f1, for example by providing the bandpass filter 252. In block 376, an individual center return path is provided through the electrode 204 for the VHF frequency f2, for example by providing the bandpass filter 254. In block 378, an edge return path is provided through the side wall for f2 and for the odd harmonic of f1, by grounding the side wall (202 of FIG. 5). In the step of block 380, the controller 270 adjusts the impedance of the f1 harmonic center return path relative to the impedance of the f1 harmonic edge return path to promote current flow at the f1 harmonic to the center return path, by adjusting the reactance of the bandpass filter 252. In the step of block 382, the controller 270 adjusts the impedance of the f2 edge return path relative to the impedance of the f2 center return path to promote current flow at the f2 frequency to the side wall, by adjusting the reactance of the bandpass filter 254. The controller 270 improves the uniformity of the radial plasma ion density distribution by selecting a ratio of VHF power between the f1 and f2 generators to control the ratio between the f1 harmonic power and f2 power coupled to the plasma (block 384). This step may be carried out to reduce a center-high plasma ion density distribution by decreasing the ratio of VHF power generated at the f1 frequency relative to VHF power at the f2 frequency (block 386). Or, this step may be carried out to reduce edge-high plasma ion density distribution nonuniformity by decreasing the ratio of VHF power at the f2 frequency relative to VHF power generated at the f1 frequency (block 388 of FIG. 11). Alternatively or in addition to the step of block 384, the controller 270 may improve uniformity of plasma ion density distribution by adjusting the impedances of the center and edge return paths of either or both f2 and the harmonic of f1 to either: (a) channel more current toward the edge in order to suppress a center-high non-uniformity or (b) channel more current toward the center to suppress an edge-high non-uniformity (block 390).

Figure 12:
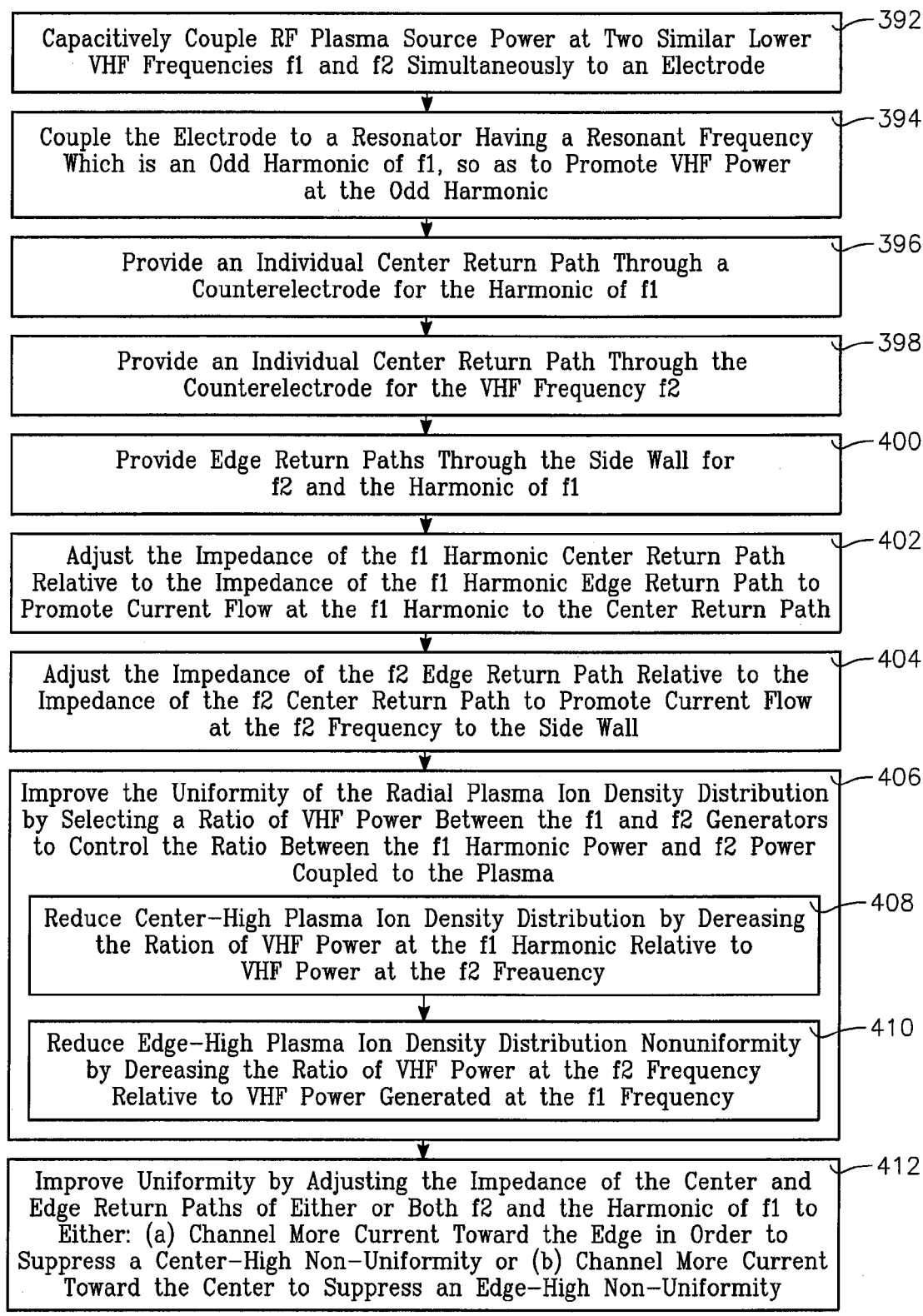
FIG. 12 illustrates a process that can be carried out in a modification of the reactor of FIG. 5 in which the locations of the f2 bandpass filter 254 and the f2 generator and match 242, 246 are exchanged.

FIG. 12 illustrates a process that can be carried out in a modification of the reactor of FIG. 5 in which the locations of the f2 bandpass filter 254 and the f2 generator and match 242, 246 are exchanged, so that both frequencies f1, f2 drive the ceiling electrode 204. At block 392, RF plasma source power at two similar lower VHF frequencies f1 and f2 simultaneously to an electrode (e.g., the ceiling electrode 204 of FIG. 5). At block 394, a resonator (274 of FIG. 5) is coupled the electrode 204, the resonator having a resonant frequency which is an odd harmonic of f1, so as to produce VHF power at the odd harmonic. This frequency up-conversion is facilitated by the non-linear response of the plasma that provides a frequency-multiplying effect. In block 396 of FIG. 12, an individual center return path is provided through a counter electrode (226 of FIG. 5) for the harmonic of f1, by providing the bandpass filter 252 coupled to ground. In block 398 of FIG. 12, an individual center ground return path is provided through the counterelectrode for the VHF frequency f2 by providing the bandpass filter 254 of FIG. 5 coupled to ground. In block 400, edge return paths are provided through the side wall for f2 and the harmonic of f1, by grounding the side wall 202 of FIG. 5. In block 402, the controller 270 adjusts the impedance of the f1 harmonic center return path relative to the impedance of the f1 harmonic edge return path to promote current flow at the f1 harmonic through the center return path, by adjusting the bandpass filter 252 of FIG. 5. In block 404 of FIG. 12, the controller 270 adjusts the impedance of the f2 edge return path relative to the impedance of the f2 center return path to promote current flow at the f2 frequency to the side wall, by adjusting the reactance of the bandpass filter 254 of FIG. 5. In block 406, the controller 270 improve the uniformity of the radial plasma ion density distribution by selecting a ratio of VHF power between the f1 and f2 generators to control the ratio between the f1 harmonic power and f2 power coupled to the plasma. This step may be carried out to reduce center-high plasma ion density distribution by decreasing the ratio of VHF power at the f1 harmonic relative to VHF power at the f2 frequency (block 408). Or, this step may be carried out to reduce edge-high plasma ion density distribution nonuniformity by decreasing the ratio of VHF power at the f2 frequency relative to VHF power at the f1 harmonic (block 410). Alternatively or in addition to the process at block 408, the controller 270 may improve uniformity by adjusting the impedances of the center and edge return paths of either or both the f1 harmonic and f2, to either: (a) channel more current toward the edge in order to suppress a center-high non-uniformity or (b) channel more current toward the center to suppress an edge-high non-uniformity (block 412 of FIG. 12).

Figure 13:
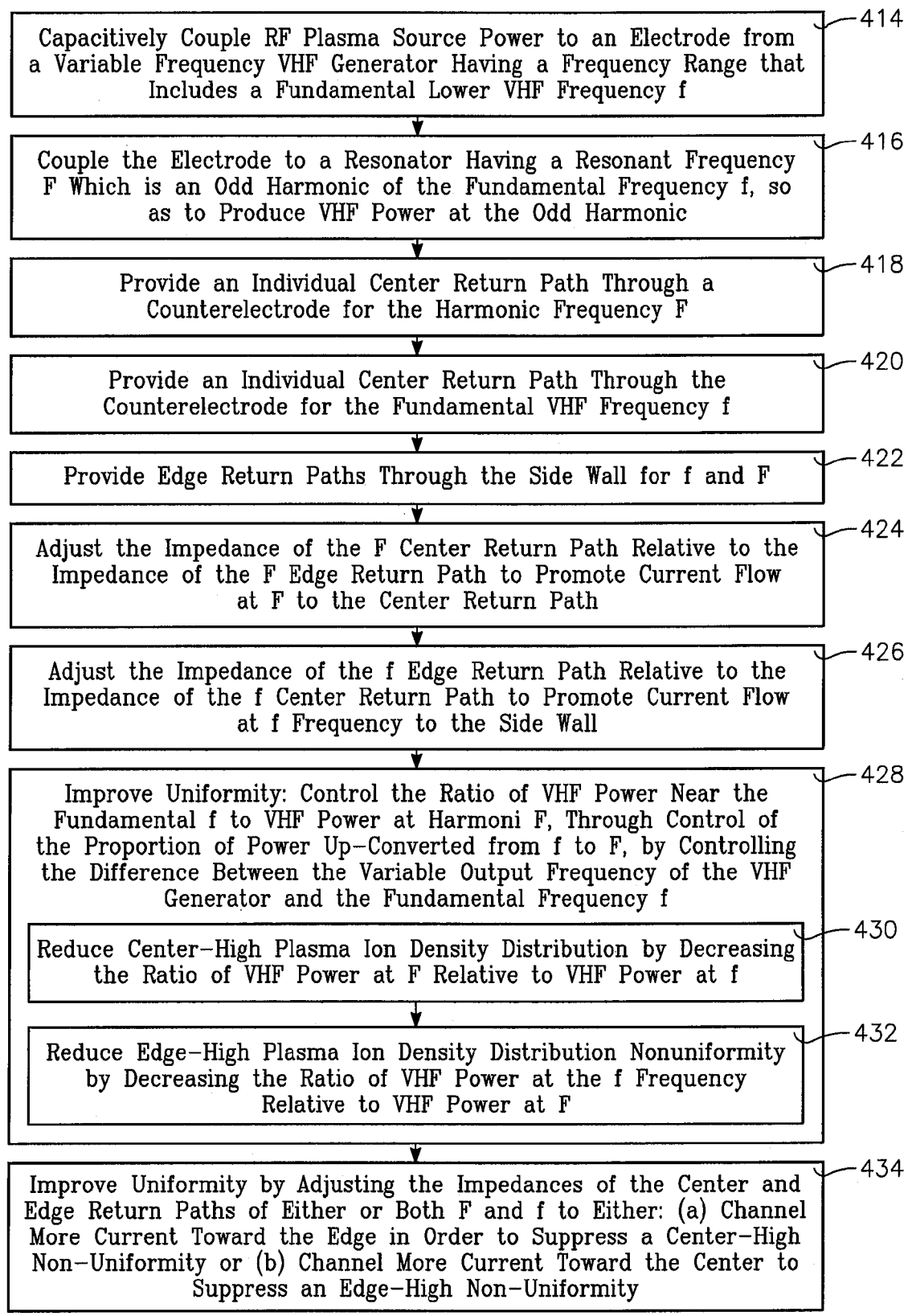
FIG. 13 illustrates a process that may be carried out in the reactor of FIG. 6, using only a single lower VHF frequency generator.

FIG. 13 illustrates a process that may be carried out in the reactor of FIG. 6, using only a single lower VHF frequency generator (between about 50-60 MHz) to realize the functionality that requires two generators in the reactors described previously herein. In block 414 of FIG. 13, RF plasma source power is capacitively coupled through an electrode (e.g., the ceiling electrode 204 of FIG. 6) from a variable frequency VHF generator 240 having a frequency range that includes a fundamental lower VHF frequency f. In block 416, a resonator 274 is coupled to the electrode 204, the resonator having a resonant frequency F which is an odd harmonic of the fundamental frequency f, so as to produce VHF power at the odd harmonic, using the plasma in the chamber as a non-linear mixing element. In block 418, an individual center return path is provided through a counterelectrode (e.g., the ESC electrode 226 of FIG. 6) for the harmonic frequency F, by providing the bandpass filter 252 coupled to ground. In block 420, an individual center return path is provided through the counterelectrode (226 of FIG. 6) for the fundamental VHF frequency f, by providing the bandpass filter 254 coupled to ground. In block 422 of FIG. 12, edge return paths through the side wall for both frequencies f and F by grounding the side wall 202 of FIG. 6. In block 424 of FIG. 12, the controller 270 adjusts the impedance of the F center return path relative to the impedance of the F edge return path to promote current flow at F to the center return path, by adjusting the variable bandpass filter 252. In block 426, the controller 270 adjusts the impedance of the f edge return path relative to the impedance of the f center return path to promote current flow at the f frequency to the side wall, by adjusting the variable bandpass filter 254. In block 428, the controller 270 improve plasma ion density distribution uniformity, by controlling the ratio of VHF power at (or near) the fundamental f to VHF power at harmonic F. This is accomplished by controlling the proportion of power up-converted from f to F. This proportion is controlled by controlling the difference between the variable output frequency of the VHF generator and the fundamental frequency f. As the generator output frequency approaches closer to the fundamental, the proportion of VHF power produced by the variable frequency generator 240 converted to the (third) harmonic F increases, for example. The maximum ratio VHF power at F to VHF power at f is attained when the generator frequency equals the fundamental f. The step of block 428 may be carried out in order to reduce a center-high plasma ion density distribution by decreasing the ratio of VHF power at F relative to VHF power at f (block 430 of FIG. 13). Or, the step of block 428 may be carried out to reduce an edge-high plasma ion density distribution nonuniformity by decreasing the ratio of VHF power at the f frequency relative to VHF power at F (block 432 of FIG. 13). Alternatively or in addition to the step of block 428, the controller 270 may improve uniformity by adjusting the impedances of the center and edge return paths of either or both F and f to either: (a) channel more current toward the edge in order to suppress a center-high non-uniformity or (b) channel more current toward the center to suppress an edge-high non-uniformity, by adjusting the respective bandpass filters 252, 254.

The use of an electrostatic chuck 218 facilitates high rates of heat transfer to or from the wafer 220, even at very low (mT) chamber pressures where heat transfer is poor without an electrostatic chuck. This feature enables the vacuum pump 228 to be a very powerful turbo pump to run chamber recipes calling for extremely low chamber pressures. These features, in combination with the VHF power sources 240, 242 that can produce very low to very high plasma ion densities (e.g., $10^9$ to $10^{11}$ ions/cc), provide a novel capability of low chamber pressure (in the mT range), high plasma ion density (in the $10^{10}$ to $10^{11}$ ion/cc range) at high bias or high heat load while maintaining complete control of wafer temperature and plasma ion density distribution uniformity. These features, which are contained in the reactors of FIGS. 1-6, fulfill the needs of certain processes such as dielectric etch plasma processes and plasma immersion ion implantation processes that impose high heat load while requiring low chamber pressure and high plasma ion density. However, these reactors are capable of performing across a wide range of chamber pressure (mT to Torr), a wide range of wafer heat load and a wide range of plasma ion density (e.g., 10^9 to 10^11 ions/cc). Therefore, the reactors of FIGS. 1-6 may also be employed in carrying out other processes at either high or low chamber pressure and at either high or low plasma ion density, such as plasma enhanced chemical vapor deposition (PECVD), plasma enhanced physical vapor deposition (PEPVD), plasma doping and plasma enhanced materials modification.

While the foregoing is directed to embodiments of the invention, other and further embodiments of the invention may be devised without departing from the basic scope thereof, and the scope thereof is determined by the claims that follow.

What is claimed is:

1. A method of processing a workpiece in a plasma reactor chamber, comprising:
   coupling RF power from a generator via an electrode to plasma in the chamber, said RF power being of a variable frequency in a frequency range that includes a fundamental frequency f;
   coupling the electrode to a resonator having a resonant VHF frequency F which is a harmonic of the fundamental frequency f, so as to produce VHF power at the harmonic from said RF power; and
   controlling the ratio of power near the fundamental f to power at harmonic F by controlling the proportion of power from the generator that is up-converted from f to F so as to control plasma ion density distribution.

2. The method of claim 1 wherein said controlling the proportion of power up-converted comprises:
   controlling the difference between the variable output frequency of the VHF generator and the fundamental frequency f.

3. The method of claim 2 wherein said controlling comprises varying the frequency of the variable frequency generator.

4. The method of claim 1 wherein said controlling comprises:
   reducing center-high plasma ion density distribution by decreasing the ratio of power at F relative to power at the frequency f.

5. The method of claim 1 wherein said controlling comprises:
   reducing edge-high plasma ion density distribution non-uniformity by decreasing the ratio of power at the frequency f relative to power at the frequency F.

6. The method of claim 1 further comprising:
   providing a first center return path for the harmonic frequency F and a second center return path for a lower frequency near f;
   providing an edge return path.

7. The method of claim 6 further comprising:
   adjusting the impedance of the first center return path relative to the impedance of the edge return path to promote current flow at the frequency F to the center return path.

8. The method of claim 6 further comprising:
   adjusting the impedance of the second center return path relative to the impedance of the edge return path to promote current flow at the f frequency to the side wall.

9. The method of claim 1 further comprising:
   adjusting the impedances of either or both the first and second center return paths to either: (a) channel more current toward the edge in order to suppress a center-high non-uniformity or (b) channel more current toward the center to suppress an edge-high non-uniformity.

10. The method of claim 1 further comprising:
    adjusting the plasma ion density distribution by adjusting a gap between the workpiece and the ceiling electrode.

11. A method of processing a workpiece in a plasma reactor chamber, comprising:
    coupling RF power from a generator via an electrode to plasma in the chamber, said RF power being of a variable frequency in a frequency range that includes a fundamental frequency f, said fundamental frequency being sufficiently low to produce a center-low edge-high non-uniformity in plasma ion density distribution;
    generating from said RF power a harmonic of the fundamental frequency f at a harmonic frequency F that is sufficiently high to produce a center-high edge-low non-uniformity in plasma ion density distribution; and
    adjusting the plasma ion density distribution on the workpiece between a center-high and a center-low distribution by controlling the proportion of power from the generator that is up-converted from f to F so as to control plasma ion density distribution.

12. The method of claim 11 wherein said controlling the proportion of power up-converted comprises:
    controlling the difference between the variable output frequency of the VHF generator and the fundamental frequency f.

13. The method of claim 12 wherein said controlling comprises varying the frequency of the variable frequency generator.

14. The method of claim 11 wherein said controlling comprises:
    reducing center-high plasma ion density distribution by decreasing the ratio of power at the frequency F relative to power at the frequency f.

15. The method of claim 11 wherein said controlling comprises:
    reducing edge-high plasma ion density distribution non-uniformity by decreasing the ratio of power at the frequency f relative to power at the frequency F.

16. The method of claim 11 further comprising:
    providing a first center return path for the harmonic frequency F and a second center return path for a lower frequency near f;
    providing an edge return path.

17. The method of claim 16 further comprising:
    adjusting the impedance of the first center return path relative to the impedance of the edge return path to promote current flow at the frequency F to the center return path.

18. The method of claim 16 further comprising:
    adjusting the impedance of the second center return path relative to the impedance of the edge return path to promote current flow at the f frequency to the edge ground return path.

19. The method of claim 16 further comprising:
    adjusting the impedances of either or both the first and second center return paths to either: (a) channel more current to the edge of the chamber in order to suppress a center-high non-uniformity or (b) channel more current toward the center of the chamber to suppress an edge-high non-uniformity.

20. The method of claim 11 further comprising:
    adjusting the plasma ion density distribution by adjusting a gap between the workpiece and the ceiling electrode.

* * * * *